(12) United States Patent
Nakadai

(10) Patent No.: US 12,119,081 B2
(45) Date of Patent: Oct. 15, 2024

(54) SEMICONDUCTOR STORAGE DEVICE AND CONTROL METHOD OF SEMICONDUCTOR STORAGE DEVICE

(71) Applicant: Fujitsu Limited, Kawasaki (JP)

(72) Inventor: Hiroshi Nakadai, Chuo (JP)

(73) Assignee: FUJITSU LIMITED, Kawasaki (JP)

( * ) Notice: Subject to any disclaimer, the term of this patent is extended or adjusted under 35 U.S.C. 154(b) by 153 days.

(21) Appl. No.: 18/151,589

(22) Filed: Jan. 9, 2023

(65) Prior Publication Data

US 2023/0290391 A1 Sep. 14, 2023

(30) Foreign Application Priority Data

Mar. 14, 2022 (JP) .................. 2022-039622

(51) Int. Cl.
*G11C 7/14* (2006.01)
*G11C 7/12* (2006.01)
*G11C 29/12* (2006.01)

(52) U.S. Cl.
CPC .................. *G11C 7/14* (2013.01); *G11C 7/12* (2013.01); *G11C 29/12005* (2013.01)

(58) Field of Classification Search
CPC ....... G11C 7/14; G11C 7/12; G11C 29/12005; G11C 7/1096; G11C 2029/5002; G11C 29/56; G11C 11/419; G11C 29/021; G11C 29/028
USPC ...................................... 365/185.2
See application file for complete search history.

(56) References Cited

U.S. PATENT DOCUMENTS

| 2009/0161449 A1 | 6/2009 | Yamagami |
| 2011/0032779 A1 | 2/2011 | Aihara et al. |
| 2023/0260570 A1* | 8/2023 | Lin ................... G11C 11/418 365/154 |

FOREIGN PATENT DOCUMENTS

| JP | 2009-151847 A | 7/2009 |
| JP | 2010-257554 A | 11/2010 |
| KR | 20180002088 A * | 1/2018 |

* cited by examiner

*Primary Examiner* — Fernando Hidalgo
(74) *Attorney, Agent, or Firm* — Fujitsu Intellectual Property Center

(57) ABSTRACT

A semiconductor storage device includes: a storage element that holds data; a bit line that is coupled to the storage element and in which step-down to reference voltage causes data held in the storage element to be inverted, a first step-down circuit that steps down bit line voltage to a first predetermined value equal to or below the reference voltage, the bit line voltage being voltage applied to the bit line; and a control circuit that detects a first voltage change based on a first output from a first inverter which has a voltage dependence of an occurring delay and a second output from a second inverter in which a voltage dependence of an occurring delay is larger than that of the first inverter, and that controls a step-down amount of the bit line voltage by the first step-down circuit depending on an amount of the detected first voltage change.

7 Claims, 36 Drawing Sheets

FIG. 20

| PATTERN | #0 | #1 | #2 | #3 |
|---|---|---|---|---|
| EN | 0 | 1 | 0 | 0 |
| SM | 0 | 0 | 1 | 1 |
| PC | N | N | N | N |
| CLK | P | P | P | P |
| SI | X | X | X | X |
| SO | X | S[0] | S[1] | S[2] |

FIG. 22

| POWER SUPPLY | S[0] | S[1] | S[2] | |
|---|---|---|---|---|
| Vmin V[0] | L | L | L | |
| V[1] | L | L | L | 541 |
| V[2] | L | L | L | |
| V[3] | H | L | L | |
| Vnom V[4] | H | L | L | |
| V[5] | H | H | L | |
| V[6] | H | H | L | |
| V[7] | H | H | L | 542 |
| Vmax V[8] | H | H | H | |

FIG. 27

| POWER SUPPLY | S[0] | S[1] | S[2] |
|---|---|---|---|
| V[0] | L | L | L |
| V[1] | L | L | L |
| V[2] | H | L | L |
| V[3] | H | L | L |
| V[4] | H | H | L |
| V[5] | H | H | L |
| V[6] | H | H | L |
| V[7] | H | H | H |
| V[8] | H | H | H |

601

| POWER SUPPLY | S[0] | S[1] | S[2] |   |
|---|---|---|---|---|
| V[0] | P | P | P | Vmin |
| V[1] | P | P | P |   |
| V[2] | F | P | P |   |
| V[3] | F | P | P |   |
| V[4] | P | P | P | Vnom |
| V[5] | P | P | P |   |
| V[6] | P | P | P |   |
| V[7] | P | P | P |   |
| V[8] | P | P | P | Vmax |

| PATTERN | #00 | #01 |
|---|---|---|
| EN | 0 | 1 |
| SM | 0 | 0 |
| PC | N | N |
| CLK | P | P |
| SI | X | X |
| SEL[2:0] | L | H or L |

FIG. 34

| INTERNAL TERMINAL | | Vmin←Vdd→Vmax | | | |
|---|---|---|---|---|---|
| DYNAMIC GATE OUTPUT | P[0] | L | H | H | H |
| | P[1] | L | L | H | H |
| | P[2] | L | L | L | H |
| XOR CIRCUIT OUTPUT | S[0] | L | H | L | L |
| | S[1] | L | L | H | L |
| | S[2] | L | L | L | H |

SEMICONDUCTOR STORAGE DEVICE AND CONTROL METHOD OF SEMICONDUCTOR STORAGE DEVICE

CROSS-REFERENCE TO RELATED APPLICATION

This application is based upon and claims the benefit of priority of the prior Japanese Patent Application No. 2022-39622, filed on Mar. 14, 2022, the entire contents of which are incorporated herein by reference.

FIELD

The embodiments discussed herein are related to a semiconductor storage device and a control method of the semiconductor storage device.

BACKGROUND

With miniaturization of semiconductor devices, manufacturing variation in memory cells has become large relative to nominal voltage. As a result, in memory cells used in a processor using dynamic voltage and frequency scaling (DVFS), a write margin decreases at low voltage, and this increases an occurrence rate of a write failure. For example, in a low-power-consumption device or the like in which power supply voltage is set to a low level, the yield of memory cells decreases.

Japanese Laid-open Patent Publication No. 2010-257554 is disclosed as related art.

SUMMARY

According to an aspect of the embodiments, a semiconductor storage device includes: a storage element that holds data; a bit line that is coupled to the storage element and in which step-down to reference voltage causes data held in the storage element to be inverted, a first step-down circuit that steps down bit line voltage to a first predetermined value equal to or below the reference voltage, the bit line voltage being voltage applied to the bit line; and a control circuit that detects a first voltage change based on a first output from a first inverter which has a voltage dependence of an occurring delay and a second output from a second inverter in which a voltage dependence of an occurring delay is larger than that of the first inverter, and that controls a step-down amount of the bit line voltage by the first step-down circuit depending on an amount of the detected first voltage change.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 20 is a diagram illustrating an example of test patterns in Embodiment 5;

FIG. 22 is a diagram illustrating an example of test results in Embodiment 5;

FIG. 27 is a diagram of an example of test results obtained in Embodiment 6;

FIG. 32 is a diagram illustrating an example of a pulse disappearance setting detection pattern;

FIG. 34 is a diagram illustrating changes in internal signals in the case where the pulse disappearance setting detection pattern is run;

DESCRIPTION OF EMBODIMENTS

Figure 1:
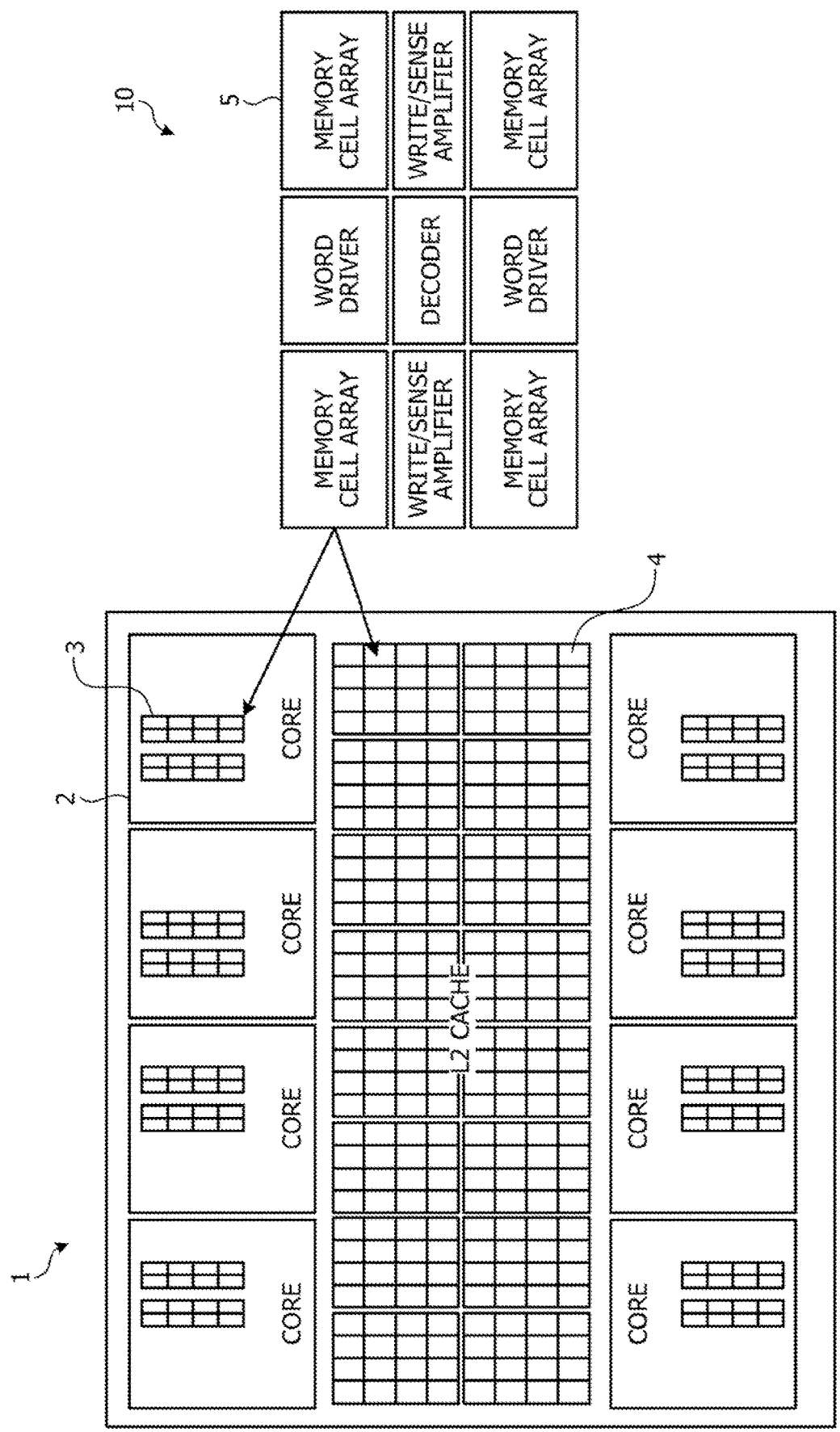
FIG. 1 is a schematic configuration diagram of an LSI.

DVFS is a method of dynamically changing a power supply voltage and an operation frequency of a processor depending on a processing load. Examples of memory cells used in a processor using DVFS include static random-access memory (SRAM) memory cells.

Various write assist circuits have been proposed as measures against the margin decrease at low voltage. Examples of the write assist circuits include a negative-bit-line circuit that assists writing to memory cells by stepping down a bit line potential to a negative potential.

In recent years, the number of processors adopting DVFS has increased to improve performance per power of processors. Accordingly, demanded operation voltage for memory cells has expanded from minimum voltage to high voltage in the technology and, from a viewpoint of performance competition, the memory cells are demanded to operate at maximum voltage at which aging deterioration of elements is acceptable.

The negative-bit-line write assist circuit is described. In writing of data to a memory cell, a potential of one bit line of a bit line pair precharged to an H level is changed from the H level to an L level. A data holding node on one side of a latch forming the cell is thereby forcibly stepped down to L via a transfer gate, and this inverts the entire latch. The writing is thus completed. However, when manufacturing variation of transistors forming the memory cells is large, there may occur a failure in which the held data is not inverted even if one bit line is completely changed from the H level to the L level. Complementary metal oxide semiconductor (CMOS) is often used for the memory cells, and an occurrence rate of such a failure is high at low voltage.

Accordingly, the negative-bit-line write assist circuit is coupled to a path extending from the bit line pair to Vdd. The bit line pair and a coupling node thereof is isolated from Vss by the write assist circuit, and are set to a floating state. A buffer mounted in the write assist circuit drives a coupling capacitance to the coupling node to step down the potential of one bit line, to be stepped down to the L level, to a negative potential lower than Vss, and thereby assists the inversion of data held in the memory cell. The magnitude of the negative potential is determined by a capacitance ratio between a bit line parasitic capacitance and the coupling capacitance.

However, in the method described above, when the voltage is increased, voltage obtained by adding positive voltage having a magnitude of the negative potential is applied between a gate and a source of the transfer gate of the memory cell. The reliability of the transistor may be thus adversely affected. For example, when the DVFS method in which the power supply voltage and the operation frequency are dynamically changed is adopted to increase power efficiency of a large scale integrator (LSI), application of voltage to the memory cell is limited to voltage obtained by subtracting voltage corresponding to the negative potential from the maximum rated voltage, and this is a constraint in the case where high-speed operation is desired.

As a countermeasure against these problems, a technique has been proposed in which the capacitance of the step-up circuit is replaced with a variable capacitance that decreases as the power supply voltage increases. A technique has been also proposed in which, when a Vdd detector detects high voltage, a step-down circuit and a step-up circuit are simultaneously operated to reduce the potential drop of the bit line.

The technique in which the capacitance of the step-up circuit is replaced with the variable capacitance that decreases as the power supply voltage increases discloses that using a variable capacitance with a voltage dependence enables reduction of the potential drop in the bit line, and proposes several structures as such variable capacitive element. However, there is no variable capacitance that has a capacitance of 0 when the maximum rated voltage is applied. Accordingly, the upper limit of the voltage that may be applied to the LSI is limited, and the operation frequency obtainable by the application of high voltage also decreases by an amount corresponding to this limitation. Since the assist operation is executed also in a high voltage range where the assist does not have to be executed, wasteful power is generated.

In the technique in which the step-down circuit and the step-up circuit are simultaneously operated to reduce the potential drop of the bit line, setting of not dropping the potential of the bit line below Vss in the high voltage range may be achieved. However, the number of arranged capacitive elements that occupy a large area of the assist circuit have to be doubled, and the area of the assist circuit increases. The assist operation is executed also in the high voltage range where the assist does not have to be executed as in Embodiment 1, and the simultaneous operation of the step-down circuit and the step-up circuit leads to very large wasteful power.

The disclosed technique has been made in view of the above circumstances, and an object thereof is to provide a semiconductor storage device and a control method of the semiconductor storage device that suppress a decrease in reliability and save power.

Embodiments of a semiconductor storage device and a control method of the semiconductor storage device disclosed in the present application are described below in detail based on the drawings. The semiconductor storage device and the control method of the semiconductor storage device disclosed in the present application are not limited to the following embodiments.

Embodiment 1

FIG. 1 is a schematic configuration diagram of an LSI. The LSI 1 is, for example, a processor. The LSI 1 includes a plurality of cores 2 and a level (L) 2 cache 4. L1 caches 3 are mounted in the cores 2. A plurality of SRAMs 10 are mounted in the L1 caches 3 and the L2 cache 4. The SRAMs 10 are semiconductor storage devices. As illustrated in FIG. 1, each of the SRAMs 10 includes memory cell arrays 5. The SRAM 10 also includes word drivers, write/sense amplifiers, and a decoder.

Figure 2:
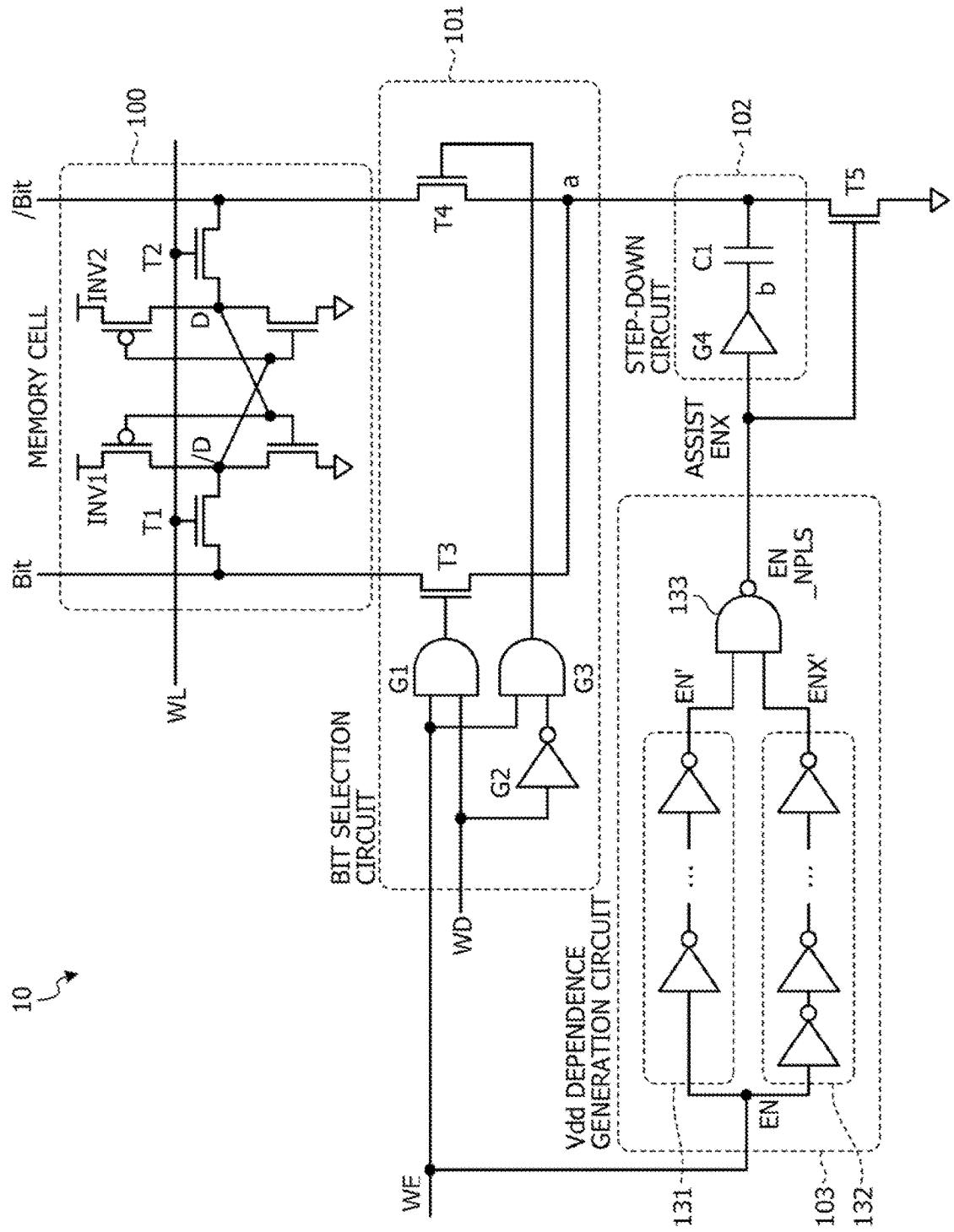
FIG. 2 is a configuration diagram of an SRAM according to an embodiment.

FIG. 2 is a configuration diagram of the SRAM according to the embodiment. The SRAM 10 includes a memory cell 100, a write amplifier 101, a step-down circuit 102, and a Vdd dependence generation circuit 103. The SRAM 10 also includes a bit line Bit and a bit line/Bit. The bit line Bit and the bit line/Bit are coupled to each other at a coupling node a via transistors T3 and T4. The SRAM 10 includes a word line WL, input paths of a write enable signal WE and a write data signal WD, and an NMOS transistor T5. A drain of the NMOS transistor T5 is coupled to the coupling node a, and a source of the NMOS transistor T5 is coupled to Vss.

The memory cell 100 is a storage element, and a plurality of memory cells 100 are mounted in each of the memory cell arrays 5 illustrated in FIG. 1. Each memory cell 100 includes transfers T1 and T2, a CMOS inverter INV2 having an output node D, and a CMOS inverter INV1 having an output node /D.

The output node /D of the CMOS inverter INV1 is coupled to the transfer T1, and the CMOS inverter INV1 is coupled to the bit line Bit via the transfer T1. The output node D of the CMOS inverter INV2 is coupled to the transfer T2, and the CMOS inverter INV2 is coupled to the bit line /Bit via the transfer T2. An input node of the CMOS inverter INV1 is coupled to an output node D of the CMOS inverter INV2. Meanwhile, an input node of the CMOS inverter INV2 is coupled to the output node /D of the CMOS inverter INV1.

Gates of the transfers T1 and T2 are coupled to the word line WL. A terminal of the transfer T1 opposite to a coupling end to the CMOS inverter INV1 is coupled to the bit line Bit. A terminal of the transfer T2 opposite to a coupling end to the CMOS inverter INV2 is coupled to the bit line /Bit.

The write amplifier 101 includes AND circuits G1 and G3, an inverter G2, and the NMOS transistors T3 and T4.

A source of the NMOS transistor T3 is coupled to the bit line Bit, and a drain of the NMOS transistor T3 is coupled to the coupling node a. A gate of the NMOS transistor T3 is coupled to an output node of the AND circuit G1. A drain of the NMOS transistor T4 is coupled to the bit line /Bit, and a source of the NMOS transistor T4 is coupled to the coupling node a. A gate of the NMOS transistor T4 is coupled to an output node of the AND circuit G3.

The write enable signal WE is inputted into one of input terminals of each of the AND circuits G1 and G3. The write data signal WD is inputted into the other input terminal of the AND circuit G1. An output terminal of the inverter G2 is coupled to the other input terminal of the AND circuit G3. The write data signal WD is inputted into an input terminal of the inverter G2.

The step-down circuit 102 includes a buffer G4 and a coupling capacitance C1. The step-down circuit 102 is an example of a "first step-down circuit".

An input terminal of the buffer G4 is coupled to an ASSIST ENX terminal that outputs an assist signal for dropping the voltage of the bit line Bit and the bit line /Bit to a negative potential. An output terminal of the buffer G4 is coupled to the coupling capacitance C1. The ASSIST ENX terminal is coupled to a gate of the NMOS transistor T5.

The coupling capacitance C1 is coupled to the output terminal of the buffer G4 and a path coupling the coupling node a to the NMOS transistor T5.

The Vdd dependence generation circuit 103 includes an inverter chain 131, an inverter chain 132, and a NAND circuit 133. The inverter chain 131 is an example of a "first inverter". The inverter chain 132 is an example of a "second inverter".

One of input terminals of the NAND circuit 133 is coupled to an EN' terminal that is an output terminal of the inverter chain 131. The other input terminal of the NAND circuit 133 is coupled to an ENX' terminal that is an output terminal of the inverter chain 132. An EN_NPLS terminal that is an output terminal of the NAND circuit 133 is coupled to the ASSIST ENX terminal.

In the inverter chain 131, an even number of stages of gates in which a voltage dependence of a delay is small are arranged in series. The voltage dependence of the delay being small means a delay amount that decreases with a voltage increase is small. Conversely, the voltage dependence of the delay being large means the delay amount that decreases with the voltage increase is large. In the inverter chain 132, an odd number of stages of gates in which the voltage dependence of the gate delay is large are arranged in series.

Figure 3:
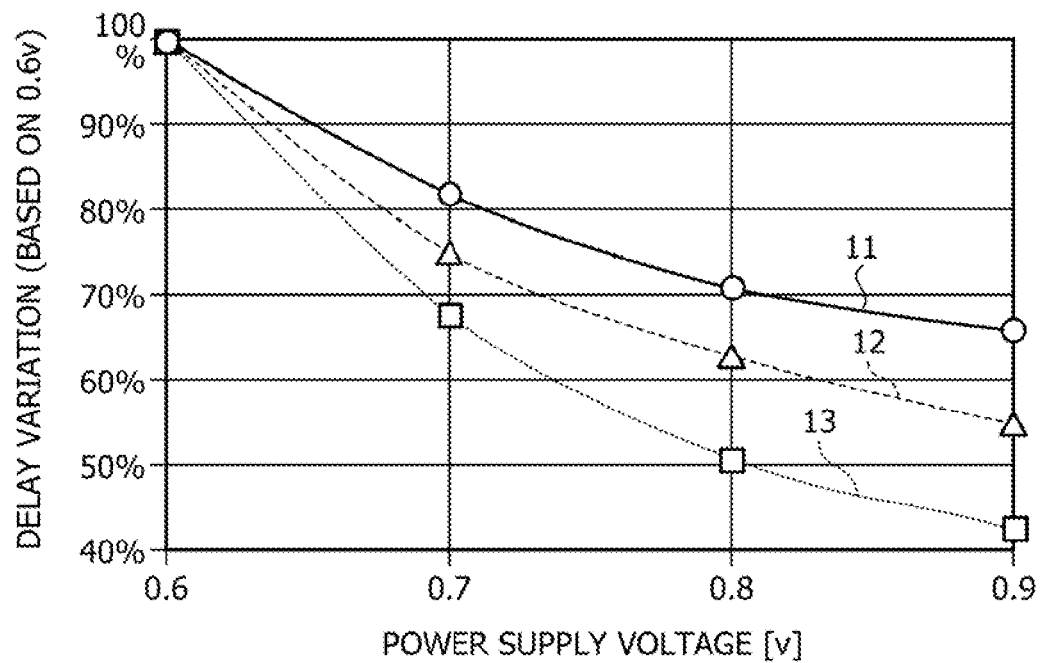
FIG. 3 is a diagram illustrating a voltage dependence of a gate delay in the case where a voltage threshold of a transistor is varied.

The voltage dependence of the gate delay may vary depending on, for example, a voltage threshold of a transistor, a circuit configuration such as multi-stage stacking of transistors, a combination thereof, or the like. FIG. 3 is a diagram illustrating the voltage dependence of the gate delay in the case where the voltage threshold of the transistor is varied. The horizontal axis of FIG. 3 represents the power supply voltage (Vdd), and the vertical axis represents a delay variation. A graph 11 illustrates a delay variation of a transistor with a small voltage threshold of a delay. A graph 13 illustrates a delay variation of a transistor with a large voltage threshold of a delay. A graph 12 illustrates a delay variation of a transistor with a voltage threshold of a delay between those in the graph 11 and the graph 13.

As illustrated in the graph 13, it may be said that the transistor with the large voltage threshold has a large delay variation, and has a large voltage dependence. Conversely, as illustrated in the graph 11, it may be said that the transistor having the small voltage threshold has a small delay variation, and has a small voltage dependence.

Accordingly, for example, in the inverter chain 131, many stages of the transistors with the small voltage threshold in FIG. 3 are arranged, and this makes the voltage dependence of the delay small. In the inverter chain 132, many stages of the transistors with the large voltage threshold in FIG. 3 are arranged, and this makes the voltage dependence of the delay large.

The number of stages of gates in each inverter chain is set such that, when Vdd is in a low voltage range, the delay of the inverter chain 132 is larger than the delay of the inverter chain 131 and, when Vdd is in a high voltage range, the delay of the inverter chain 132 is equal to or smaller than the delay of the inverter chain 131.

The write enable signal WE is inputted into an EN terminal that is an input terminal of the inverter chain 131 and the inverter chain 132.

When Vdd is in the low voltage range, since the delay of the inverter chain 132 is larger than the delay of the inverter chain 131, the EN terminal changes from L that is a Vss level to H that is a Vdd level, and this causes a negative pulse to be generated from the EN_NPLS terminal. Conversely, when Vdd is in the high voltage range, since the delay of the inverter chain 132 is equal to or smaller than the delay of the inverter chain 131, no negative pulse is generated from the EN_NPLS terminal even if the EN terminal changes from L that is the Vss level to H that is the Vdd level.

Figure 4:
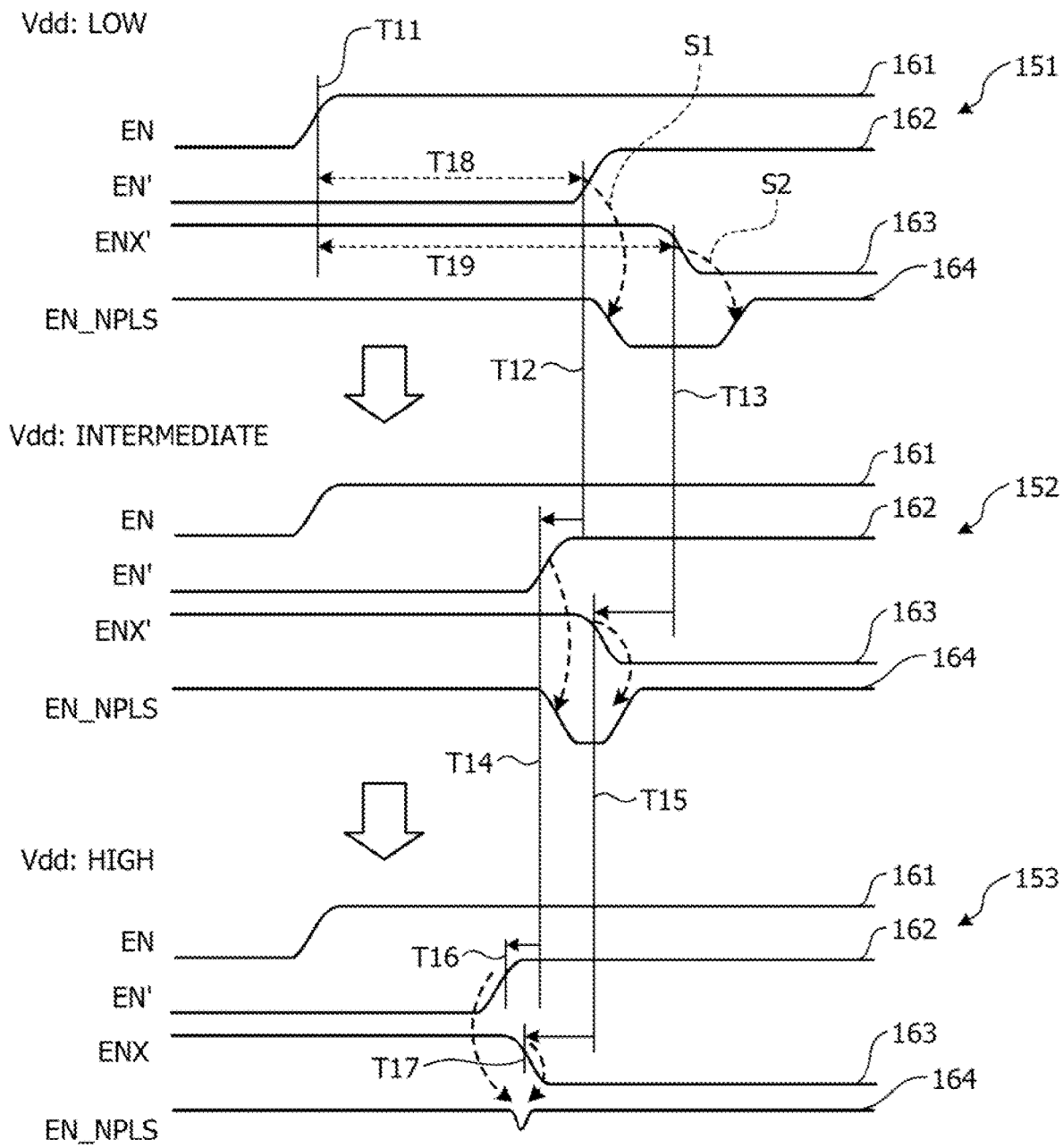
FIG. 4 is a diagram illustrating relationships between a level of Vdd and a width of a negative pulse.

FIG. 4 is a diagram illustrating relationships between the level of Vdd and the width of the negative pulse. The vertical axis of each of graphs 151 to 153 represents voltage, and the horizontal axis represents a lapse of time. The graph 151 illustrates an operation waveform of each of signals in the case where Vdd is in the low voltage range. The graph 152 illustrates an operation waveform of each of the signals in the case where Vdd is in an intermediate voltage range between the low voltage range and the high voltage range. The graph 153 illustrates an operation waveform of each of the signals in the case where Vdd is in the high voltage range. Relationships between the magnitude of Vdd and the negative pulse generated at the EN_NPLS terminal are described with reference to FIG. 4.

A waveform 161 illustrates a voltage change at the EN terminal of Vdd dependence generation circuit 103. A waveform 162 illustrates a voltage change at the EN' terminal of the inverter chain 131. A waveform 163 illustrates a voltage change at the ENX' terminal of the inverter chain 132. A waveform 164 illustrates a voltage change at the EN_NPLS terminal of the NAND circuit 133.

The case where Vdd is in the low voltage range is described. As illustrated in the graph 151, the EN terminal changes from L to H at a timing T11. Then, the EN' terminal changes from L to H at a timing T12 that is a point where a period T18 has elapsed from the timing T11, and the EN_NLPS terminal of the NAND circuit 133 thereby changes from H to L (step S1), the period T18 being the delay of the inverter chain 131. For example, before the timing T12, the EN' terminal is L and the ENX' terminal is H, the EN_NLPS terminal of the NAND circuit 133 is thus H. After the timing T12, the EN' terminal and the ENX' terminal are both H, the EN_NLPS terminal of the NAND circuit 133 is thus L.

In this case, a period T19 that is a delay, from the timing T11, of the inverter chain 132 with the large voltage dependence is longer than the period T18 that is the delay, from the timing T11, of the inverter chain 131 with the small voltage dependence. Accordingly, the ENX' terminal changes from H to L at a timing T13 that is later than the timing T12 and that is a point where the period T19 has elapsed from the timing T11 (step S2). The negative pulse outputted from the EN_NLPS terminal is thereby generated. Processing indicated by the arrows in the graphs 152 and 153 also correspond to the respective processing illustrated in the graph 151.

As illustrated in the graph 152, when Vdd increases from the low voltage range to the intermediate voltage range, the delay times of both of the inverter chains 131 and 132 become shorter. Accordingly, the change of the EN' terminal from L to H occurs at a timing T14 earlier than the timing T12. The change of the ENX' terminal from H to L occurs at a timing T15 earlier than the timing T13. Note that, since the voltage dependence of the inverter chain 132 is larger than that of the inverter chain 131, a degree at which the delay of the inverter chain 132 is shortened is greater than that of the inverter chain 131. Accordingly, an interval between the timing T14 and the timing T15 is shorter than an interval between the timing T12 and the timing T13. For example, the width of the negative pulse outputted from the EN_NLPS terminal becomes smaller.

As illustrated in the graph 153, when the voltage further increases and Vdd reaches the high voltage range, the delay times of both of the inverter chains 131 and 132 become even shorter. The change of the EN' terminal from L to H thereby occurs at a timing T16 earlier than the timing T14. The change of the ENX' terminal from H to L occurs at a timing T17 earlier than the timing T15. Note that an interval between the timing T16 and the timing T17 is even shorter than the interval between the timing T14 and the timing T15. In this case, the EN_NLPS terminal returns to H before completely dropping from H to L. The negative pulse is thus not generated as illustrated in the graph 153.

Description continues by returning to FIG. 2. Changing the numbers of stages of gates and a combination of voltage dependencies in the inverter chains 131 and 132 adjusts voltage at which no negative pulse is generated.

An operation in data writing to the SRAM 10 is described next. Before writing to the memory cell 100, the bit lines Bit and /Bit are precharged to H. The word line WL is L, and the write enable signal WE is L. The ASSIST EXT terminal is H. At this time, the outputs of the AND circuits G1 and G3 are L, the NMOS transistors T3 and T4 are off, and the NMOS transistor T5 is on. The coupling node a is L.

The data writing to the memory cell 100 is performed by changing the word line WL from L to H to turn on the transfers T1 and T2 of the memory cell 100 and then transitioning the write enable signal WE from L to H. At this time, the write data signal WD turns on the NMOS transistor T3 or the NMOS transistor T4 depending on inputted data, and either the bit line Bit or/Bit is stepped down to Vss. An internal node of the memory cell 100 is thereby forcibly set to L, and normal writing is completed. For example, when the write data signal WD is H, the NMOS transistor T3 is turned on, and the bit line Bit is stepped down to Vss.

The transition of the write enable signal WE from L to H causes the EN terminal common to the inverter chain 131 and the inverter chain 132 of the Vdd dependence generation circuit 103 to simultaneously transition from L to H.

When Vdd is in the low voltage range, for example, is about 0.5 V, the delay at the EN' terminal of the inverter chain 131 is earlier than the delay at the ENX' terminal of the inverter chain 132. Accordingly, signals of opposite phases depending on a difference between the delays are inputted into the NAND circuit 133. A negative pulse is thereby generated at the ASSIST_ENX terminal that is equal to the output of the EN_NPLS terminal of the NAND circuit 133. This negative pulse is generated behind the write enable signal WE by a time equal to the delay of the inverter chain 131. The normal writing performed by stepping down the aforementioned bit line Bit to Vss is completed within the delay time of the negative pulse with respect to the write enable signal WE.

The negative pulse generated at the ASSIST_ENX terminal turns off the NMOS transistor T5 coupling the bit line Bit to Vss during a period in which L due to the negative pulse continues. The bit line Bit and the coupling node a are thereby isolated from Vss while at L to be brought into a floating state, and are set to 0 V that is an initial potential.

Immediately after the turn-off of the NMOS transistor T5, the negative pulse drives the coupling capacitance C1 from H to L via the buffer G4. The bit line Bit that is 0 V due to the floating is thereby further stepped down to a negative potential below Vss by a (V) that is predetermined voltage. For example, the bit line Bit is boosted to a negative potential in response to a leading edge of the negative pulse, and assist of stepping down the bit line Bit to the negative potential continues for the period of the pulse width. The internal node of the memory cell 100 is thus more strongly stepped down, and the SRAM 10 may secure a write margin in the memory cell 100. The predetermined voltage a is determined based on a capacitance ratio between a parasitic capacitance of the bit lines Bit and /Bit and the coupling capacitance C1. The bit line Bit is then reset to Vss in response to the change from L to H due to the trailing edge of the negative pulse.

The operation in the low voltage range such as, for example, at 0.5 V has been described above. Next, the case where the voltage increases from the low voltage range is described. The voltage dependence of the delay of the inverter chain 132 is larger than the voltage dependence of the delay of the inverter chain 131. An increase in voltage thus reduces the delay difference between the inverter chain 131 and the inverter chain 132. For example, the assist period equal to the width of the negative pulse generated at the ASSIST ENX terminal becomes shorter. When the voltage reaches or exceeds a certain level, no negative pulse is generated at the ASSIST ENX terminal, and the ASSIST ENX terminal is fixed at H level. Thus, no assist is performed. Since the Vdd dependence generation circuit 103 and the step-down circuit 102 do not operate in the state where there is no assist, the bit line Bit does not fall below Vss. Accordingly, in a voltage range in which the assist does not have to performed, such as, for example, at 0.9 V, no negative pulse is generated at the ASSIST ENX terminal. This may suppress application of stress equal to or above the power supply voltage to the transfer T1 of the memory cell 100. Wasteful power consumption due to the assist may also be reduced.

In the case of the high voltage, unlike in the case of the low voltage, a situation where a write operation margin is insufficient seldom occurs even in a CMOS. Thus, a probability of a failure occurring in the memory cell 100 may be maintained at a low value even without the stepping-down of the bit line Bit to a negative potential.

Figure 5:
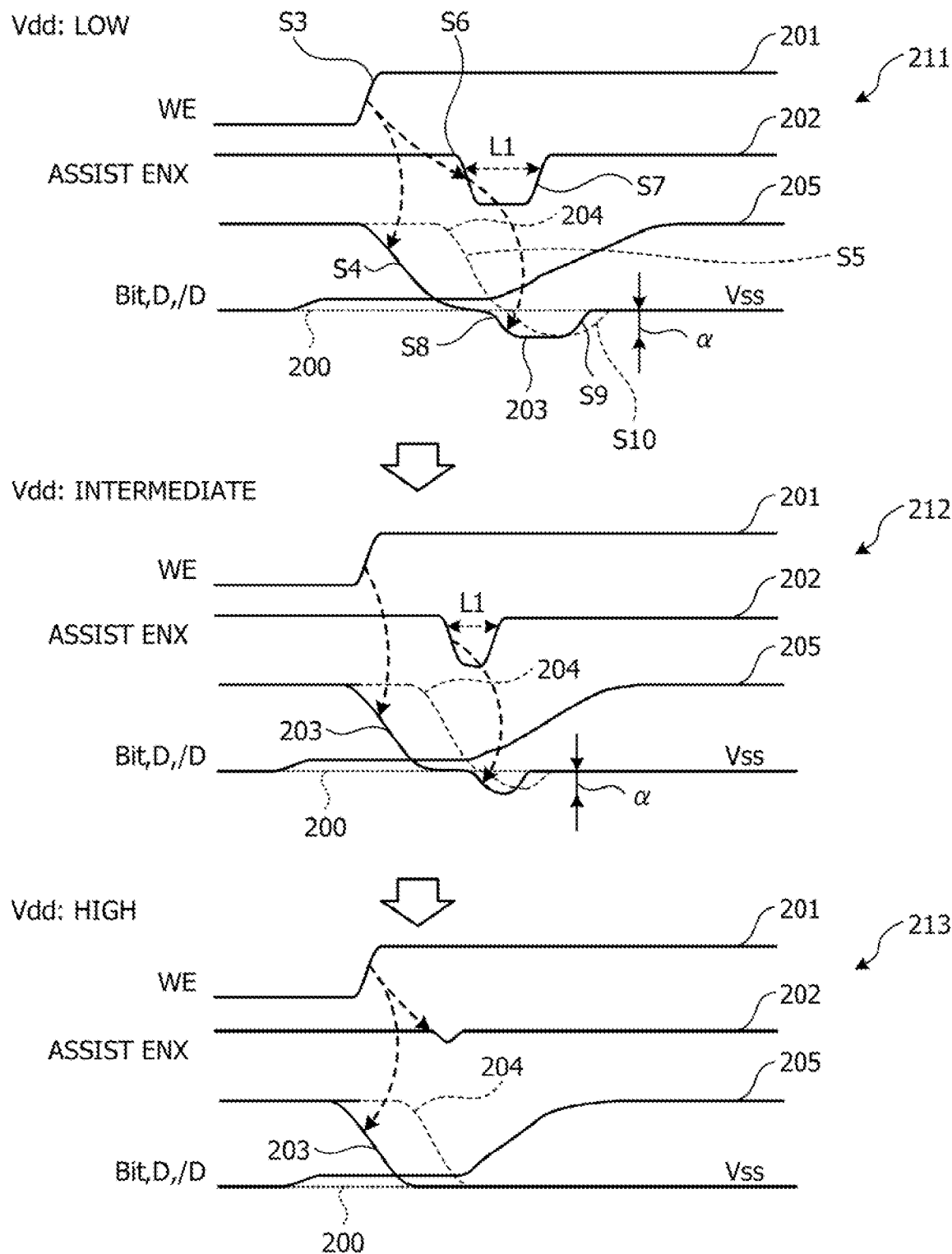
FIG. 5 is a diagram illustrating an operation waveform of each of signals in an SRAM according to Embodiment 1.

FIG. 5 is a diagram illustrating an operation waveform of each of signals in the SRAM according to Embodiment 1. Next, a voltage change in each of the signals in the data writing in the semiconductor storage device according to Embodiment 1 is described with reference to FIG. 5. Also in this case, the case where the data writing is performed by, for example, setting the write data signal WD to H to turn on the NMOS transistor T3 and step down the bit line Bit to Vss is described as an example.

The vertical axis of each of graphs 211 to 213 in FIG. 5 represents voltage, and the horizontal axis represents a lapse of time. The graph 211 illustrates an operation waveform of each of signals in the case where Vdd is in the low voltage range. The graph 212 illustrates an operation waveform of each of the signals in the case where Vdd is in the intermediate voltage range between the low voltage range and the high voltage range. The graph 213 illustrates an operation waveform of each of the signals in the case where Vdd is in the high voltage range.

A waveform 201 in FIG. 5 illustrates a voltage change of the write enable signal WE. A waveform 202 illustrates a voltage change at the ASSIST ENX terminal. A waveform 203 illustrates a voltage change in the bit line Bit. A waveform 204 illustrates a voltage change at the output node D. A waveform 205 illustrates a voltage waveform at the output node /D. A potential 200 illustrates Vss that is a reference for each of the bit line Bit, the output node D, and the output node /D.

The operation waveforms of the respective signals in the case where Vdd is in the low voltage range that are illustrated in the graph 211 are described. When the data writing is performed, the write enable signal WE changes from L to H as illustrated by the waveform 201 (step S3). In response to this, the bit line Bit changes from H to L as illustrated by the waveform 203 (step S4). When the bit line Bit changes to L, the output node D that is a cell internal node is stepped down to L as illustrated by the waveform 204 (step S5).

In this case, the ASSIST ENX terminal changes from H to L as illustrated by the waveform 202 (step S6). The ASSIST ENX terminal is L during a period L1, and then changes to H (step S7). This voltage change at the ASSIST ENX terminal generates a negative pulse with a pulse width of the period L1. The bit line Bit is boosted to the negative potential a as illustrated by the waveform 203 in response to the leading edge of the negative pulse (step S8). The internal node of the memory cell 100 is thereby more strongly stepped down. The negative potential continues in the bit line Bit during the period L1 of the pulse width. The bit line Bit is then reset to Vss in response to the change from L to H due to the trailing edge of the negative pulse (step S9). The D signal then returns from the negative voltage state to Vss (step S10), and is maintained at L. The writing of data to the memory cell 100 is thus completed.

As illustrated by the graph 212, when Vdd increases from the low voltage range to the intermediate voltage range, the delay difference between the inverter chain 131 and the inverter chain 132 decreases. The assist period L1 that is the width of the negative pulse generated at the ASSIST ENX terminal thereby becomes shorter. Although the assist period L1 becomes shorter, the bit line Bit is stepped down to the negative potential a as illustrated by the waveform 203 of the graph 212 and, in response to this, the output node D that is the cell internal node is also stepped down to the negative potential a as illustrated by the waveform 204 of the graph 212, also in this case. The writing to the memory cell 100 is thereby more strongly performed.

Meanwhile, when Vdd reaches the high voltage range, the delay difference between the inverter chain 131 and the inverter chain 132 further decreases as illustrated by the graph 213. The assist period L1 that is the width of the negative pulse generated at the ASSIST ENX terminal thereby disappears as illustrated by the waveform 202 of the graph 213. When Vdd becomes even higher, a decrease in voltage generated in the waveform 202 also disappears, and the ASSIST ENX terminal is fixed to H. In this case, the bit line Bit drops to Vdd, but is not stepped down to a negative potential below Vdd as illustrated by the waveform 203 of graph 213.

As described above, the Vdd dependence generation circuit 103 corresponds to an example of a "control unit", detects the power supply voltage based on a first output from a first inverter which has a voltage dependence of an occurring delay and a second output from a second inverter in which a voltage dependence of an occurring delay is larger than that of the first inverter, and controls a step-down amount of the bit line voltage by the first step-down circuit depending on the amount of the detected power supply voltage. For example, the Vdd dependence generation circuit 103 causes the step-down circuit 102 to step down the bit line to the negative potential a that is a first predetermined value, during a period of a difference between a timing of the first output in response to an input of a predetermined signal to the EN terminal and a timing of the second output in response to the input of the same predetermined signal.

Figure 6:
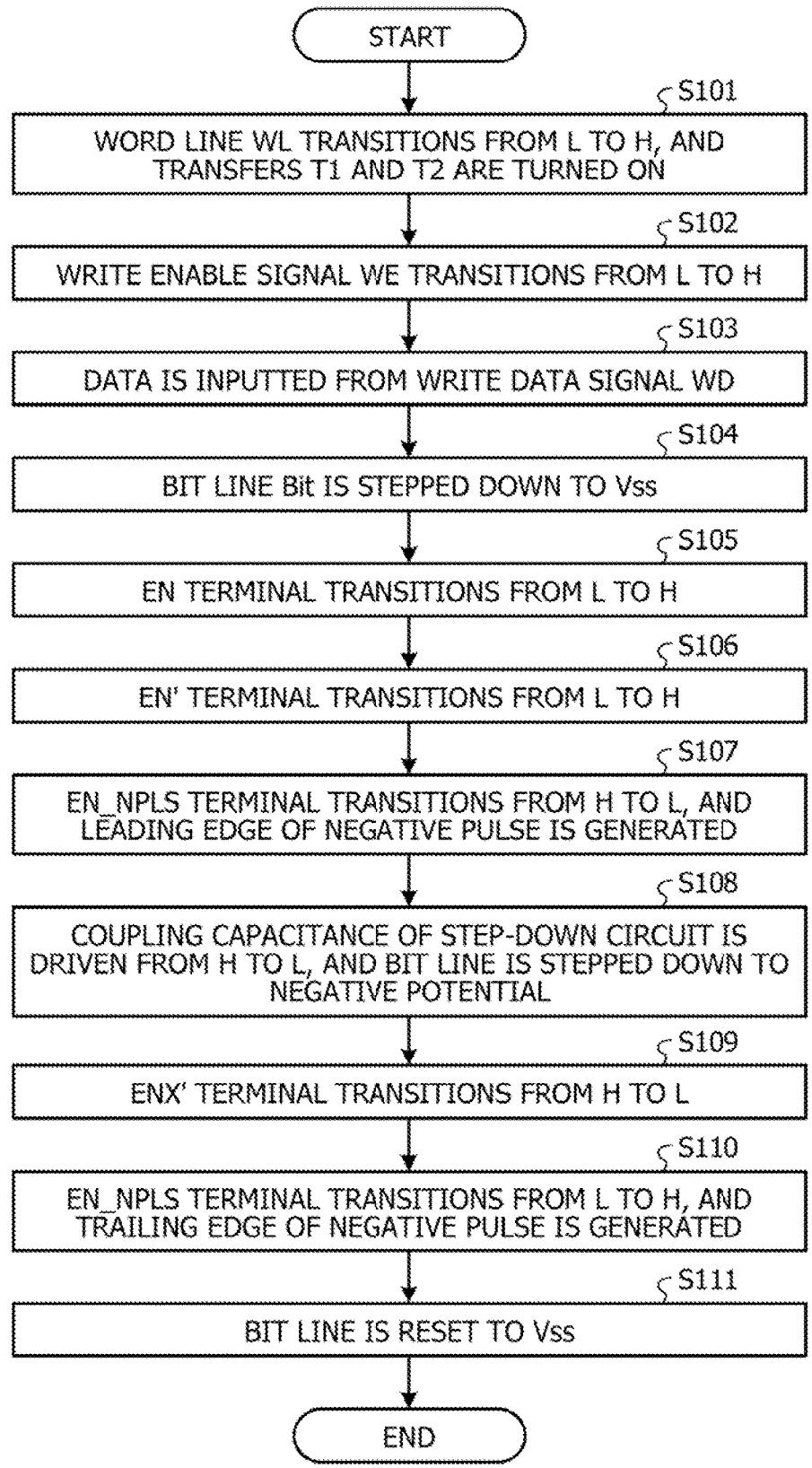
FIG. 6 is a flowchart of data rewriting processing in a low voltage range in the SRAM according to Embodiment 1.

FIG. 6 is a flowchart of data rewriting processing in the low voltage range in the SRAM according to Embodiment 1. The flow of the data rewriting processing in the low voltage range in the SRAM 10 according to the present embodiment is described next with reference to FIG. 6. In this section, description is given of the case where writing is performed by stepping down the voltage of the bit line Bit.

The word line WL changes from L to H, and the transfers T1 and T2 of the memory cell 100 are turned on (step S101).

The write enable signal WE then transitions from L to H (step S102).

Next, data is inputted by using the write data signal WD (step S103).

The NMOS transistor T3 is turned on in response to the input with the write data signal WD, and the bit line Bit is stepped down to Vss (step S104).

The transition of the write enable signal WE from L to H causes the EN terminal common to the inverter chain 131 and the inverter chain 132 of the Vdd dependence generation circuit 103 to simultaneously transition from L to H (step S105).

The EN' terminal of the inverter chain 131 then transitions from L to H (step S106).

The EN_NPLS terminal then transitions from H to L, and the leading edge of the negative pulse is generated at the ASSIST_ENX terminal (step S107).

The negative pulse generated at the ASSIST_ENX terminal turns off the NMOS transistor T5 coupling the bit line Bit to Vss. The negative pulse also drives the coupling capacitance C1 from H to L via the buffer G4. The bit line Bit that is 0 V due to the floating is thereby further stepped down to the negative potential below Vss by the predetermined voltage (step S108).

The ENX' terminal then transitions from H to L with a delay corresponding to a difference between the delay of the inverter chain 131 and the delay of the inverter chain 132 (step S109).

Next, the EN_NPLS terminal transitions from L to H, and the trailing edge of the negative pulse is generated at the ASSIST_ENX terminal (step S110).

The bit line Bit is then reset to Vss in response to the change from L to H due to the trailing edge of the negative pulse (step S111).

Figure 7:
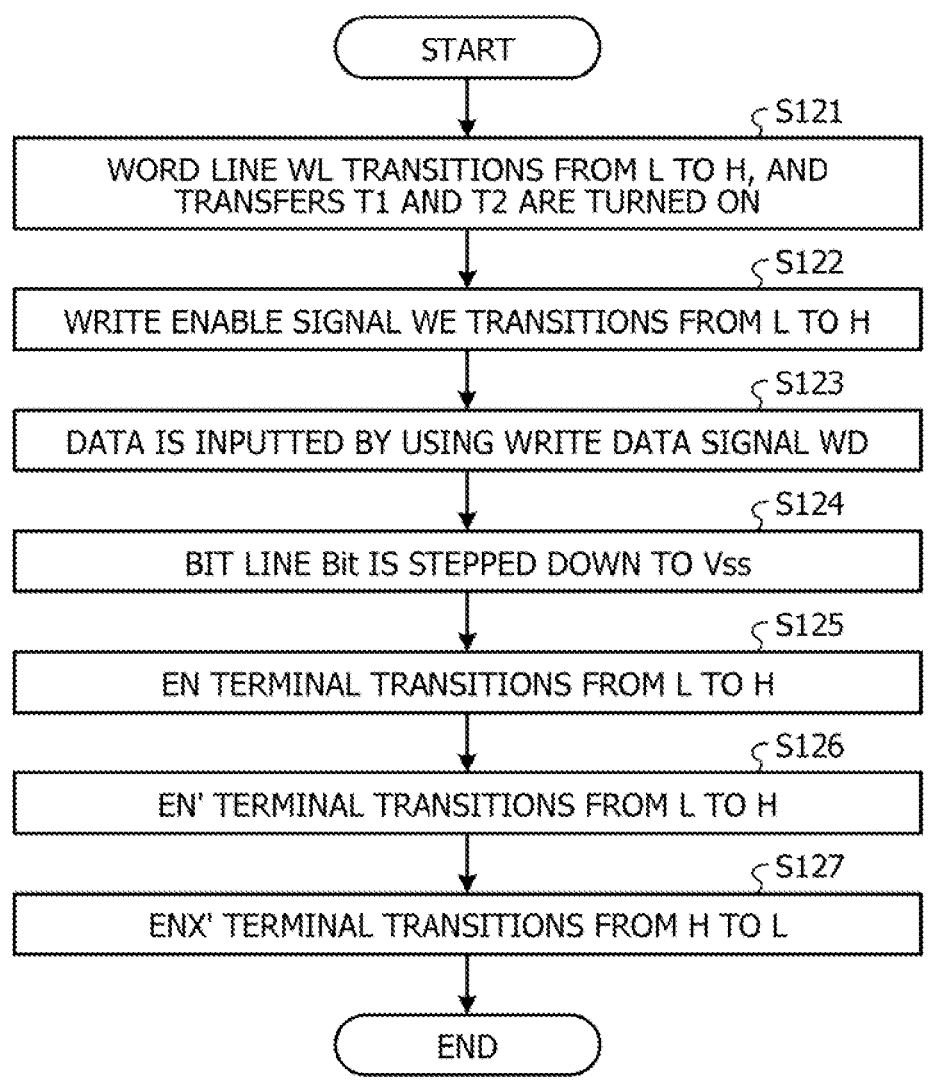
FIG. 7 is a flowchart of data rewriting processing in a high voltage range in the SRAM according to Embodiment 1.

FIG. 7 is a flowchart of data rewriting processing in the high voltage range in the SRAM according to Embodiment 1. The flow of the data rewriting processing in the high voltage range in the SRAM 10 according to the present embodiment is described next with reference to FIG. 7. Also in this section, description is given of the case where writing is performed by stepping down the voltage of the bit line Bit.

The word line WL changes from L to H, and the transfers T1 and T2 of the memory cell 100 are turned on (step S121).

The write enable signal WE then transitions from L to H (step S122).

Next, data is inputted by using the write data signal WD (step S123).

The NMOS transistor T3 is turned on in response to the input with the write data signal WD, and the bit line Bit is stepped down to Vss (step S124).

The transition of the write enable signal WE from L to H causes the EN terminal common to the inverter chain 131 and the inverter chain 132 of the Vdd dependence generation circuit 103 to simultaneously transition from L to H (step S125).

The EN' terminal of the inverter chain 131 then transitions from L to H (step S126).

Since the difference between the delay of the inverter chain 131 and the delay of the inverter chain 132 is small in the high voltage range, the ENX' terminal transitions from H to L before the EN_NPLS terminal transitions from H to L (step S127). The bit line Bit is thereby maintained at Vss without being stepped down to the negative potential.

As described above, in the semiconductor storage device according to the present embodiment, when Vdd is low voltage, the voltage of the bit line is dropped to the negative potential below Vss in the data writing and, when Vdd is high voltage, the voltage of the bit line is dropped to Vss in the data writing.

For example, in the technique in which the capacitance of the step-up circuit is replaced by the variable capacitance that decreases as the power supply voltage increases, the assist circuit operates in all voltage ranges. Accordingly, wasteful power is generated in a range where no failure occurs even without the assist. When the maximum rated voltage is applied to the memory cell, voltage equal to or above the maximum rated voltage is applied to the memory cell due to the assist circuit, and thus a characteristic deterioration or a problem in reliability occurs.

Meanwhile, in the semiconductor storage device according to the present embodiment, the write assist is automatically, completely canceled at high voltage. Accordingly, deterioration of the memory cell may be reduced. In the semiconductor storage device according to the present embodiment, an operation voltage may be freely set as long as the operating voltage is equal to or below the maximum rated voltage. Accordingly, use of the semiconductor storage device according to the present embodiment may expand an operation speed range to the maximum and also improve power efficiency of the LSI in the DVFS method. Wasteful power due to assist that does not have to be performed may also be reduced.

In the technique of simultaneously operating the step-down circuit and the step-up circuit to reduce the potential drop in the bit line, the write assist may be completely canceled in the high voltage range. However, in order to achieve this, the step-down circuit and the step-up circuit are simultaneously operated.

Meanwhile, in the semiconductor storage device according to the present embodiment, the step-down circuit may be shut down. Accordingly, it is possible to suppress the size of the capacitive element occupying a large area in the assist circuit to a small size, and also reduce wasteful power for canceling the assist in the high voltage range. In the semiconductor storage device according to the present embodiment, it is possible to automatically change the assist amount stepwise and suppress a power increase due to the assist to the minimum.

Although a processor or the like may control a write assist circuit of a mounted memory, this design leads to an increase in development cost for logic design, implementation, signal distribution, and timing design for the control of the write assist circuit. Meanwhile, in the case of the semiconductor storage device according to the present embodiment, an LSI designer may freely perform DVFS settings or the like while suppressing the development cost by using the memory cell incorporating the write assist.

Embodiment 2

Figure 8:
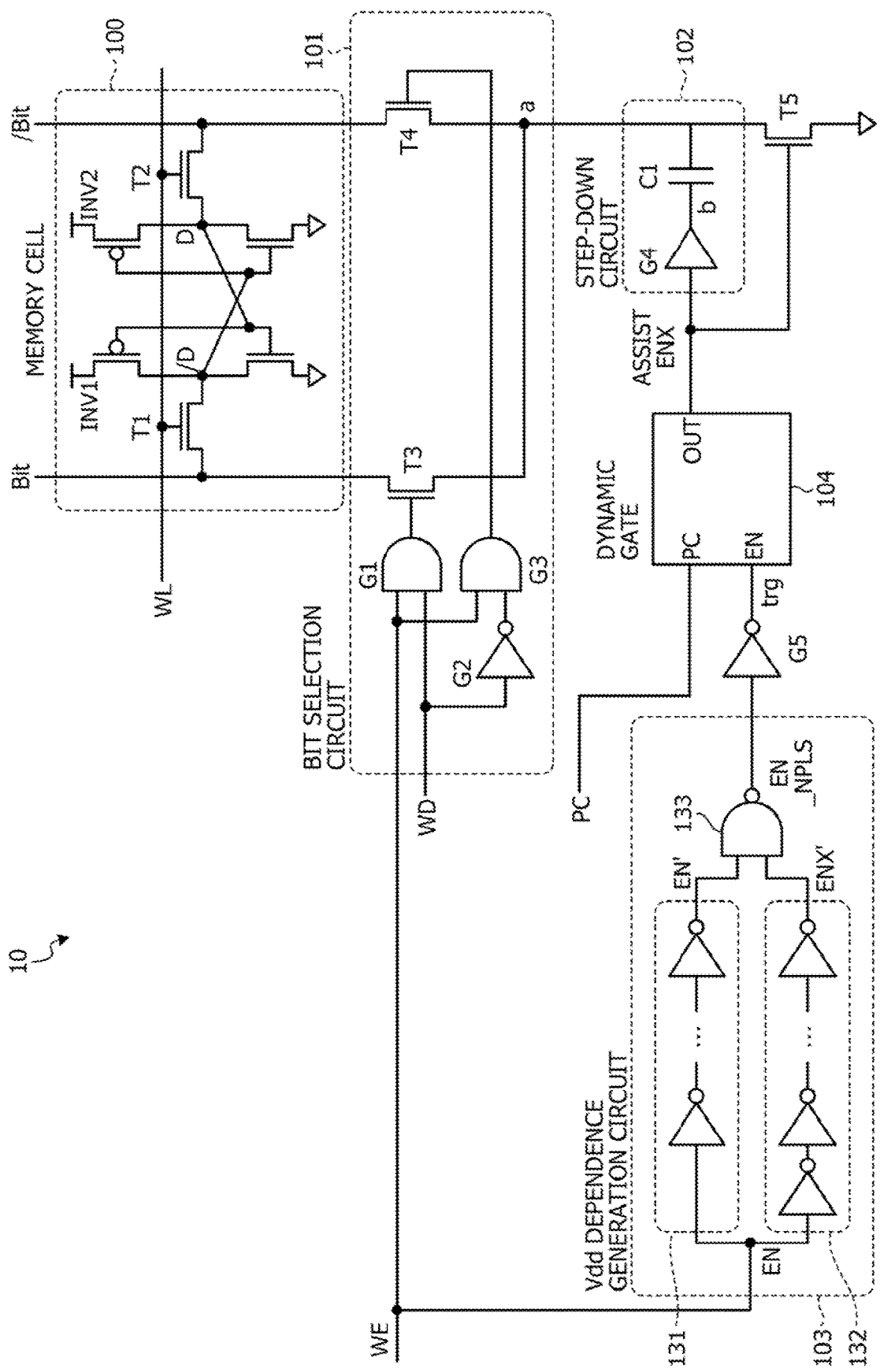
FIG. 8 is a configuration diagram of an SRAM according to Embodiment 2.

FIG. 8 is a configuration diagram of an SRAM according to Embodiment 2. The SRAM 10 according to the present embodiment is different from that in Embodiment 1 in that the assist for dropping the bit line Bit to the negative potential is maintained for a certain period. The SRAM 10 according to the present embodiment further includes an inverter G5 and a dynamic gate 104. Description of a function of each of parts that are the same as those in Embodiment 1 are omitted in the following description.

In the Vdd dependence generation circuit 103, the write enable signal WE is inputted into the EN terminal that is the input terminal. In the Vdd dependence generation circuit 103, the EN_NPLS terminal that is the output terminal of the negative pulse is coupled to an input of the inverter G5.

The inverter G5 generates a trg signal that is a signal obtained by converting the negative pulse outputted from the Vdd dependence generation circuit 103 to a positive pulse. The inverter G5 inputs the trg signal into an EN terminal of the dynamic gate 104.

The dynamic gate 104 includes a PC terminal and the EN terminal that are two input terminals and an OUT terminal that is an output terminal. The PC terminal of the dynamic gate 104 is coupled to a precharge line PC to which a control instruction is outputted. The OUT terminal of the dynamic gate 104 is coupled to the ASSIST ENX terminal.

Figure 9:
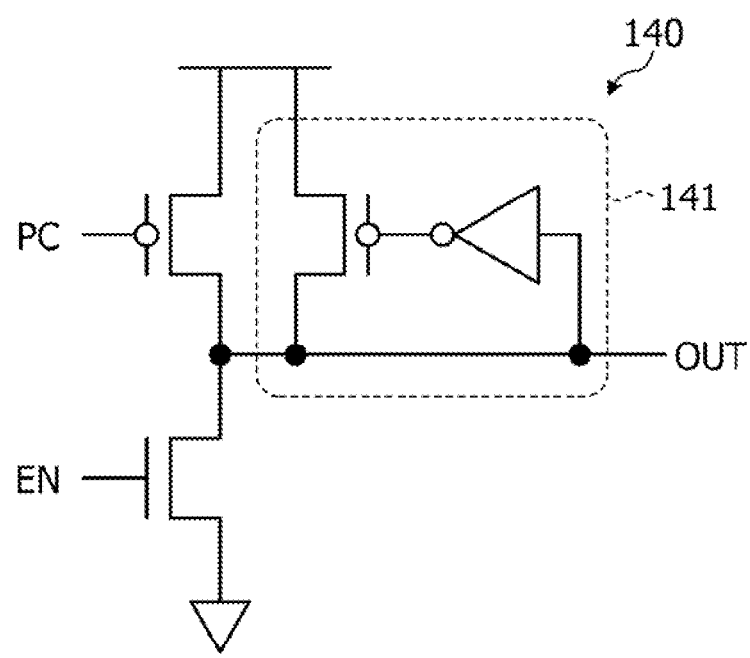
FIG. 9 is a circuit diagram illustrating an example of a dynamic gate.

FIG. 9 is a circuit diagram illustrating an example of the dynamic gate. The PC terminal of the dynamic gate 104 extends from a gate of a P-channel FET switch coupled to Vdd. The EN terminal of the dynamic gate 104 extends from a gate of an N-channel FET switch arranged between Vss and the FET switch to which the PC terminal is coupled. A coupling point between the FET switch to which the PC terminal is coupled and the FET switch to which the EN terminal is coupled is coupled to the OUT terminal, and an H keeper 141 is arranged between the coupling point and the OUT terminal.

Figure 10:
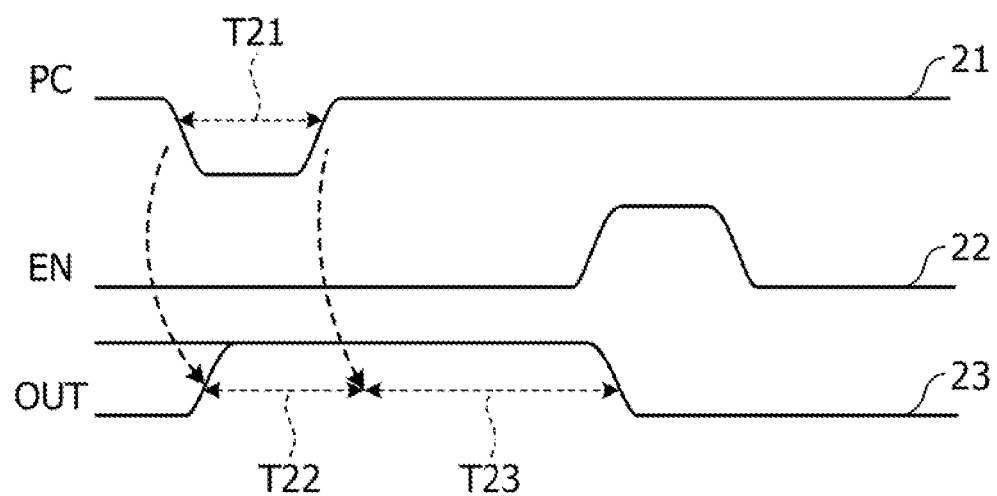
FIG. 10 is a diagram illustrating operation waveforms of the dynamic gate.

FIG. 10 is a diagram illustrating operation waveforms of the dynamic gate. The vertical axis of FIG. 10 represents voltage and the horizontal axis represents a lapse of time. A graph 21 illustrates a waveform of an input signal to the PC terminal, a graph 22 illustrates a waveform of an input signal to the EN terminal, and a graph 23 illustrates a waveform of an output signal from the OUT terminal.

In the dynamic gate 104, a negative pulse having a width of a period T21 is inputted from the precharge line PC into the PC terminal as illustrated in the graph 21, with the trg signal inputted into the EN terminal being L as illustrated in the graph 22. In the dynamic gate 104, the output from the OUT terminal is thereby precharged to H during the period T22 corresponding to the period T21 as illustrated by the graph 23. In the dynamic gate 104, even when the period T21 elapses and the PC terminal returns to H, the H keeper 141 continuously maintains the output from the OUT terminal at H during a period T23 as illustrated in the graph 23. Then, a change of the trg signal inputted into the EN terminal to H ends the period T23, and the output from the OUT terminal of the dynamic gate 104 changes from H to L. In the dynamic gate 104, an input of the negative pulse from the precharge line PC in the next cycle resets the output from the OUT terminal to H, and the operation illustrated in FIG. 10 is repeated. The dynamic gate 104 is an example of a "holding circuit". The period T23 is an example of a "predetermined period".

Figure 11:
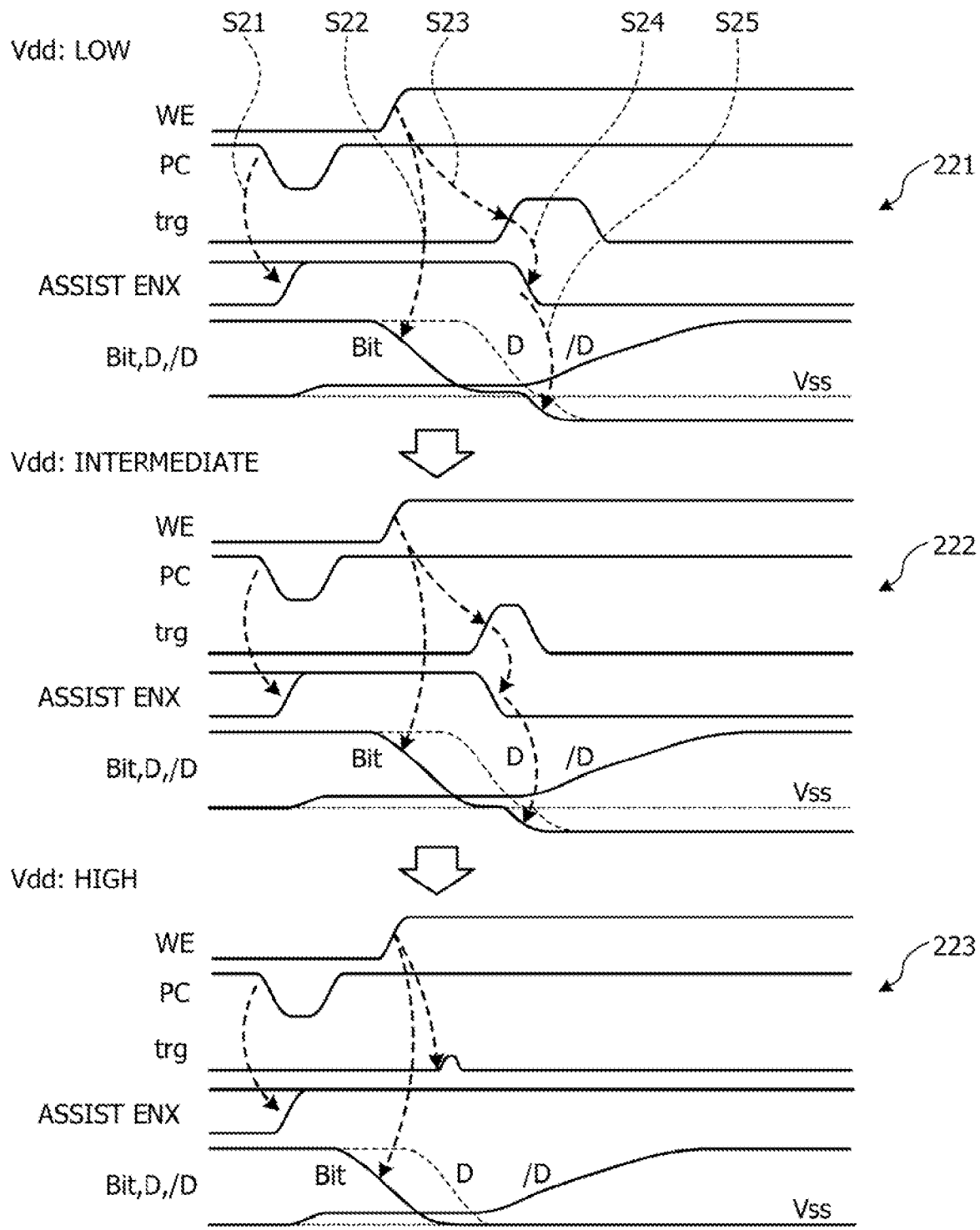
FIG. 11 is a diagram illustrating an operation waveform of each of signals in the SRAM according to Embodiment 2.

FIG. 11 is a diagram illustrating an operation waveform of each of signals in the SRAM according to Embodiment 2. An operation of the SRAM 10 according to the present embodiment is described next with reference to FIG. 11. The vertical axis of each of graphs 221 to 223 in FIG. 11 represents voltage, and the horizontal axis represents a lapse of time. The graph 221 illustrates an operation waveform of each of signals in the case where Vdd is in the low voltage range. The graph 222 illustrates an operation waveform of each of the signals in the case where Vdd is in the intermediate voltage range between the low voltage range and the high voltage range. The graph 223 illustrates an operation waveform of each of the signals in the case where Vdd is in the high voltage range.

Prior to the transition of the write enable signal WE from L to H, in the dynamic gate 104, the negative pulse is applied to the PC terminal, the output from the OUT terminal is reset to H, and the ASSIST ENX terminal changes from L to H (step S21). Next, when the write enable signal WE changes from L to H, the bit line Bit is dropped to Vss. When Vdd is a low voltage, the Vdd dependence generation circuit 103 generates the negative pulse upon the change of the write enable signal WE from L to H (step S22). The inverter G5 generates the trg signal obtained by converting the negative pulse outputted from the Vdd dependence generation circuit 103 to the positive pulse, and inputs the trg signal into the EN terminal of the dynamic gate 104 (step S23). In the dynamic gate 104, inputting the trg signal into the EN terminal changes the output from the OUT terminal from H to L (step S24). The ASSIST ENX terminal thereby changes from H to L, and the bit line Bit is driven to the negative potential (step S25). Processing indicated by the arrows in the graph 222 correspond to the respective processing described in the graph 221. Processing indicated by the arrows in the graph 223 correspond to the processing of steps S21 to S23 in the graph 221.

As Vdd increases, the trg signal inputted into the EN terminal becomes narrower as illustrated in the graph 222. When the voltage further increases and Vdd reaches a high voltage range, no negative pulse is generated in the Vdd dependence generation circuit 103, and the trg signal also becomes small. Accordingly, the bit line Bit does not drop to the negative potential below Vss.

As described above, in the semiconductor storage device according to the present embodiment, when Vdd is low voltage, the ASSIST ENX terminal transitions from H to L, and is then held at L until the reset is performed with the input signal from the precharge line PC in the next cycle. During the period in which the ASSIST ENX terminal is held at L, the bit line remains at the negative potential. Since the semiconductor storage device according to Embodiment 1 performs the assist only during the period of the pulse width, it is preferable to increase the step-down amount of the bit line to some extent for sufficient assist. Meanwhile, in the semiconductor storage device according to the present embodiment, since the assist period may be extended, the assist intensity may be relatively small. Accordingly, it is possible to reduce the capacitance for the assist and suppress the area and power of the assist circuit.

In the semiconductor storage device according to the present embodiment, the assist is completely canceled in the high voltage range. Accordingly, it is possible to apply voltage up to the maximum rated voltage to the SRAM without being restricted by the withstanding voltage of the memory cell. The semiconductor storage device according to the present embodiment suppresses the operation of the step-down circuit itself by canceling the assist. Accordingly, the power consumption may be suppressed to a low level in the high voltage range.

Embodiment 3

Figure 12:
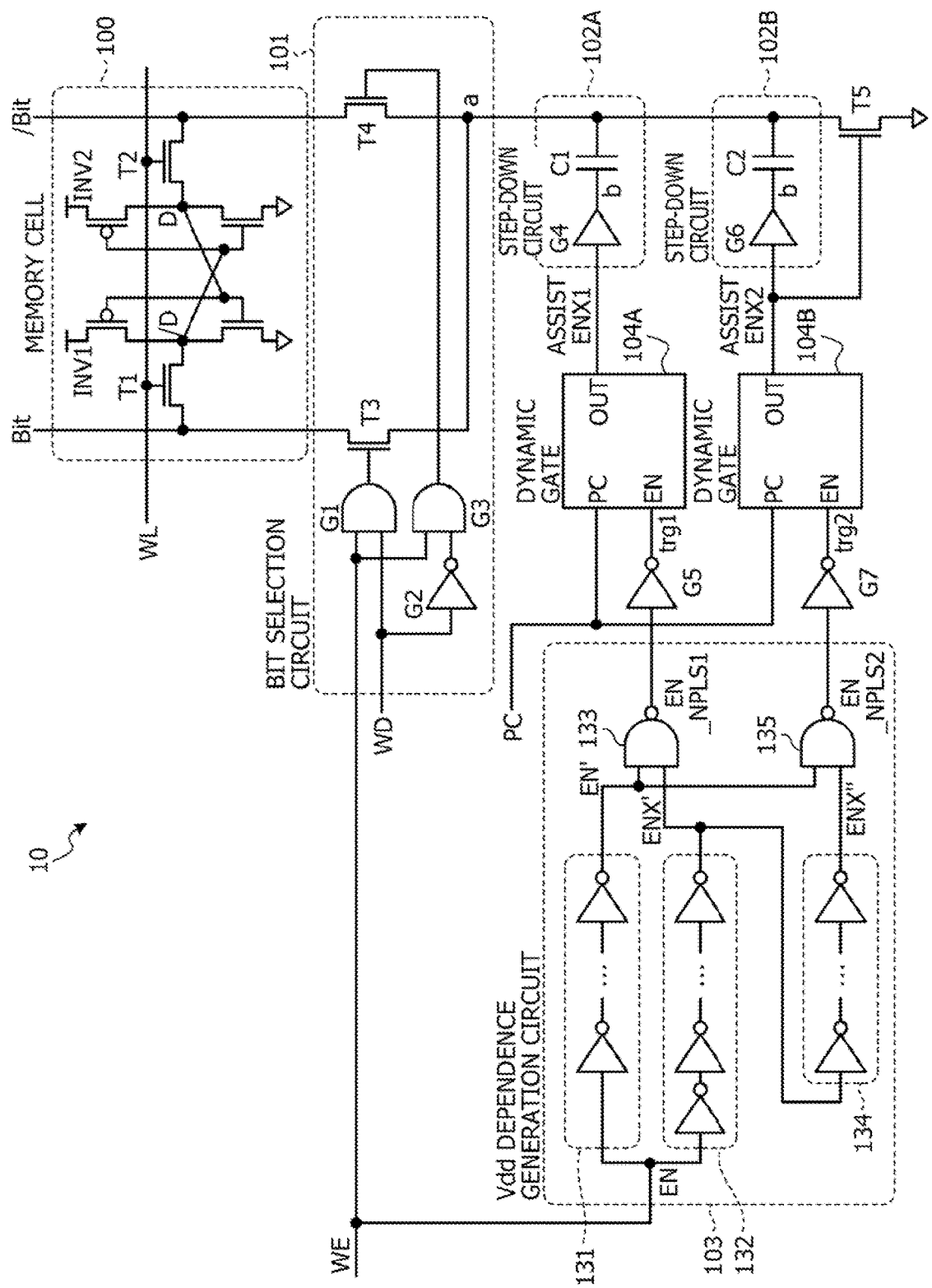
FIG. 12 is a configuration diagram of an SRAM according to Embodiment 3.

FIG. 12 is a configuration diagram of an SRAM according to Embodiment 3. The SRAM 10 according to the present embodiment is different from that in Embodiment 2 in that the step-down amount of the bit line Bit is changed depending on voltage. In the following description, description of the function of each of the already-described parts is omitted.

The Vdd dependence generation circuit 103 according to the present embodiment has two outputs, and these outputs vary in voltage at which no pulses is generated therefrom. The Vdd dependence generation circuit 103 includes an inverter chain 134 in addition to the inverter chain 131 and the inverter chain 132. The Vdd dependence generation circuit 103 also includes a NAND circuit 135 in addition to the NAND circuit 133.

In the inverter chain 134, an even number of stages of gates including transistors in which the voltage dependence of the gate delay is large are arranged in series. For example, in the inverter chain 134, the voltage dependence of the delay is large. An input terminal of the inverter chain 134 is coupled to the output terminal of the inverter chain 132. An ENX" terminal that is an output terminal of the inverter chain 134 is coupled to one of input terminals of the NAND circuit 135. The inverter chain 134 is an example of a "third inverter".

The one input terminal of the NAND circuit 135 is coupled to the ENX" terminal that is the output terminal of the inverter chain 134. The other input terminal of the NAND circuit 135 is coupled to the EN' terminal that is the output terminal of the inverter chain 131.

In this section, the output terminal of the NAND circuit 133 is referred to as an EN_NPLS1 terminal, and an output terminal of the NAND circuit 135 is referred to as an EN_NPLS2 terminal.

The EN_NPLS1 terminal that is the output terminal of the NAND circuit 133 is coupled to the input terminal of the inverter G5. The EN_NPLS2 terminal that is the output terminal of the NAND circuit 135 is coupled to an input terminal of an inverter G7. An output signal of the inverter G5 is referred to as a trg1 signal, and an output signal of the inverter G7 is referred to as a trg2 signal.

The trg1 signal outputted from the inverter G5 is inputted into an EN terminal of a dynamic gate 104A. The trg2 signal outputted from the inverter G7 is inputted into an EN terminal of a dynamic gate 104B. PC terminals of both of the dynamic gates 104A and 104B are coupled to the precharge line PC. An OUT terminal that is an output terminal of the dynamic gate 104A is coupled to an ASSIST ENX1 terminal. An OUT terminal that is an output terminal of the dynamic gate 104B is coupled to an ASSIST ENX2 terminal.

A step-down circuit 102A includes the buffer G4 and the coupling capacitance C1. The input terminal of the buffer G4 is coupled to the ASSIST ENX1 terminal. An output terminal of the buffer G4 is coupled to the coupling capacitance C1. The coupling capacitance C1 is coupled to a portion between the coupling node a and the NMOS transistor T5.

A step-down circuit 102B includes a buffer G6 and a coupling capacitance C2. An input terminal of the buffer G6 is coupled to the ASSIST ENX2 terminal. An output terminal of the buffer G6 is coupled to the coupling capacitance C2. The coupling capacitance C2 is coupled to a portion between the coupling node a and the NMOS transistor T5. The ASSIST ENX2 terminal is coupled to a gate of the NMOS transistor T5. The step-down circuits 102A and 102B are examples of a "first step-down circuit" and a "second step-down circuit".

As described above, the SRAM 10 according to the present embodiment is provided with two sets of control circuits, a set of the step-down circuit 102A and the dynamic gate 104A being a control circuit thereof and a set of the step-down circuit 102B and the dynamic gate 104B being a control circuit thereof, and the sets are coupled respectively to the two output terminals of the Vdd dependence generation circuit 103.

An operation of the SRAM 10 according to the present embodiment is described. When Vdd is in the low voltage range, both of the step-down circuits 102A and 102B operate. As the voltage of Vdd increases, the step-down circuit 102A stops, and eventually both of the step-down circuits 102A and 102B stop operating. Although the case where two sets of control circuits are provided has been described in this section, three or more sets of control circuits each including the step-down circuit 102 and the dynamic gate 104 may be provided. In a configuration including multiple sets of control circuits, when Vdd is in the low voltage range, all step-down circuits 102 operate. As Vdd increases, the number of the operating step-down circuits 102 decreases, and eventually all step-down circuits 102 stop operating.

Figure 13:
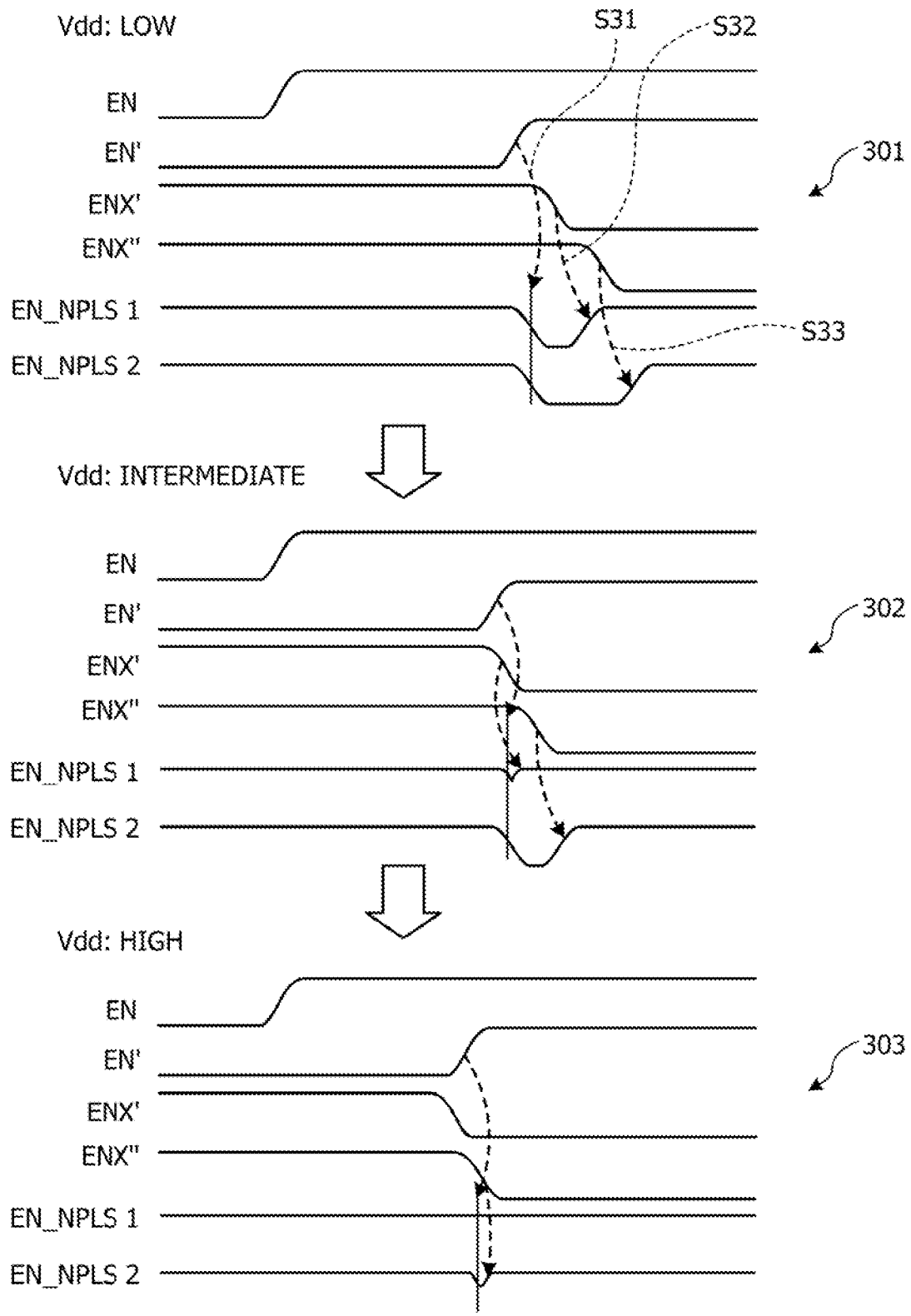
FIG. 13 is a diagram illustrating operation waveforms of a Vdd dependence generation circuit according to Embodiment 3.

FIG. 13 is a diagram illustrating operation waveforms of the Vdd dependence generation circuit according to Embodiment 3. The vertical axis of each of graphs 301 to 303 in FIG. 13 represents voltage, and the horizontal axis represents a lapse of time. The graph 301 illustrates an operation waveform of each of signals in the case where Vdd is in the low voltage range. The graph 302 illustrates an operation waveform of each of the signals in the case where Vdd is in the intermediate voltage range between the low voltage range and the high voltage range. The graph 303 illustrates an operation waveform of each of the signals in the case where Vdd is in the high voltage range.

An output from the EN' terminal and an output from the ENX" terminal of the inverter chain 134 are inputted into the NAND circuit 135. The NAND circuit 135 outputs a signal from the EN_NPLS2 terminal. Both of the EN_NPSL1 terminal and the EN_NPSL2 terminal are dropped to L at a timing at which the output from the EN' terminal changes to H (step S31). The EN_NPSL1 terminal returns to H at a timing at which the ENX' terminal changes to L (step S32). The EN_NPSL2 terminal returns to H at a timing at which the ENX" terminal changes to L (step S33).

Processing indicated by the arrows in the graph 302 correspond to the respective processing in the graph 301. Processing indicated by the arrows in the graph 303 correspond to the processing of steps S31 and S33 in the graph 301.

Since the delay at the ENX" terminal is larger than that at the ENX' terminal depending on the delay by the inverter chain 134, a negative pulse generated at the EN_NPLS2 terminal has a larger width than the negative pulse generated at the EN_NPLS1 terminal. Accordingly, when Vdd is in the low voltage range, the negative pulses are generated at both of the EN_NPLS1 terminal and the EN_NPLS2 terminal as illustrated in the graph 301. When the voltage of Vdd is increased, the negative pulse at the EN_NPLS1 terminal disappears, and the negative pulse generated at the EN_NPLS2 terminal remains as illustrated in the graph 302. When the voltage of Vdd is further increased and reaches the high voltage range, no negative pulse is generated at the EN_NPLS1 terminal or the EN_NPLS2 terminal as illustrated in the graph 303.

Assume that a potential desirable for writing at expected minimum voltage is Vss-2a and a capacitance desirable for generating this potential is C. In this case, the coupling capacitances C1 and C2 are set such that a sum thereof is C. Adjusting the number of stages and the voltage dependence of the delay in each of the inverter chains 131, 132, and 134 forming the Vdd dependence generation circuit 103 enables adjustment of the width of the corresponding negative pulse, and enables adjustment of voltage at which the corresponding negative pulse disappears. For example, the adjustment may be made such that, when the voltage reaches a level at which writing at Vss-a is possible, the generation of the pulse at the EN_NPLS1 terminal stops.

Figure 14:
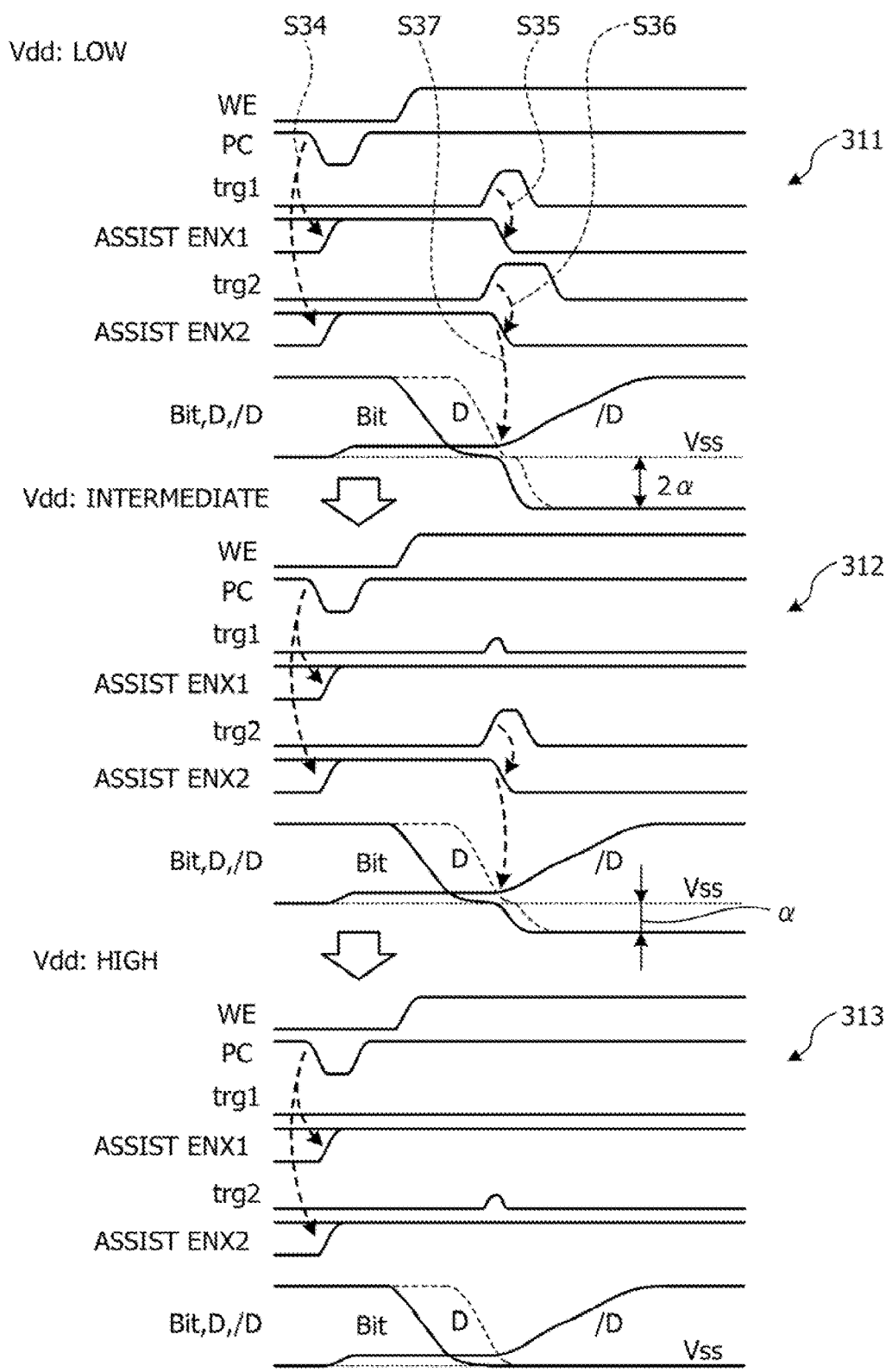
FIG. 14 is a diagram illustrating operation waveforms of the SRAM according to Embodiment 3.

FIG. 14 is a diagram illustrating operation waveforms of the SRAM according to Embodiment 3. The vertical axis of each of graphs 311 to 313 in FIG. 14 represents voltage, and the horizontal axis represents a lapse of time. The graph 311 illustrates an operation waveform of each of signals in the case where Vdd is in the low voltage range. The graph 312 illustrates an operation waveform of each of the signals in the case where Vdd is in the intermediate voltage range between the low voltage range and the high voltage range. The graph 313 illustrates an operation waveform of each of the signals in the case where Vdd is in the high voltage range.

When Vdd is in the low voltage range, as illustrated in the graph 311, the PC signals are inputted from the precharge line PC into the dynamic gates 104A and 104B, and both of the ASSIST_ENX1 terminal and the ASSIST_ENX2 terminal change to H (step S34). Then, the trg1 signal is inputted into the dynamic gate 104A and the OUT terminal changes to H. This causes the ASSIST_ENX1 terminal to change from L to H (step S35). Similarly, the trg2 signal is inputted into the dynamic gate 104B and the OUT terminal changes to H. This causes the ASSIST_ENX2 terminal to change from L to H (step S36). Both of the step-down circuits 102A and 102B thereby operate to step down the bit line Bit to Vss-2a (step S37).

Processing indicated by the arrows in the graph 312 correspond to the processing of steps S34, S36, and S37 in the graph 311. A processing indicated by the arrow in the graph 313 corresponds to the processing of steps S34 in the graph 311.

When the voltage of Vdd is increased and reaches the level at which writing at Vss-a is possible, the generation of the negative pulse at the EN_NPLS1 terminal stops, and the trg1 signal disappears as illustrated in the graph 312. In this case, the operation of the step-down circuit 102A stops, and the operation of the step-down circuit 102B continues to step down the bit line Bit to Vss-a.

When Vdd reaches the high voltage range and reaches a level at which writing at Vss is possible, the generation of the negative pulse at the EN_NPLS2 terminal also stops, and the trg2 signal disappears as illustrated in the graph 313. In this case, the operations of both of the step-down circuits 102A and 102B stop, and the bit line Bit is stepped down only to Vss.

As described above, in the semiconductor storage device according to the present embodiment, the step-down amount of the bit line changes stepwise depending on the level of the voltage. Accordingly, it is possible to reduce wasteful power and suppress deterioration of the memory cell to the minimum by reducing the voltage applied to the memory cell. Although the configuration including two sets of the Vdd dependence generation circuits and the step-down circuits is described in this section, the effects may be improved by increasing the number of the sets.

Although the configuration using the dynamic gates has been described above, a similar configuration may be incorporated in the configuration of Embodiment 1 using no dynamic gates.

Embodiment 4

Next, Embodiment 4 is described. A SRAM 10 according to the present embodiment is different from that in Embodiment 2 in that voltage at which the generation of the drive pulse of the step-down circuit 102 stops is adjustable. In the following description, description of the function of each of the already-described parts is omitted.

In the Vdd dependence generation circuit 103 according to the present embodiment, the voltage at which the generation of the drive pulse of the step-down circuit 102 stops is adjusted by using an external signal. In the Vdd dependence generation circuit 103, one or both of the number of stages in the inverter chain 131 that determines the leading edge of the negative pulse and that has the small voltage dependence and the number of stages in the inverter chain 132 that determines the trailing edge of the negative pulse and that has the large voltage dependence may be switched from the outside. In the Vdd dependence generation circuit 103, the width of the negative pulse to be outputted is thereby changed and, as a result, the voltage at which the pulse disappears is adjusted.

Figure 15:
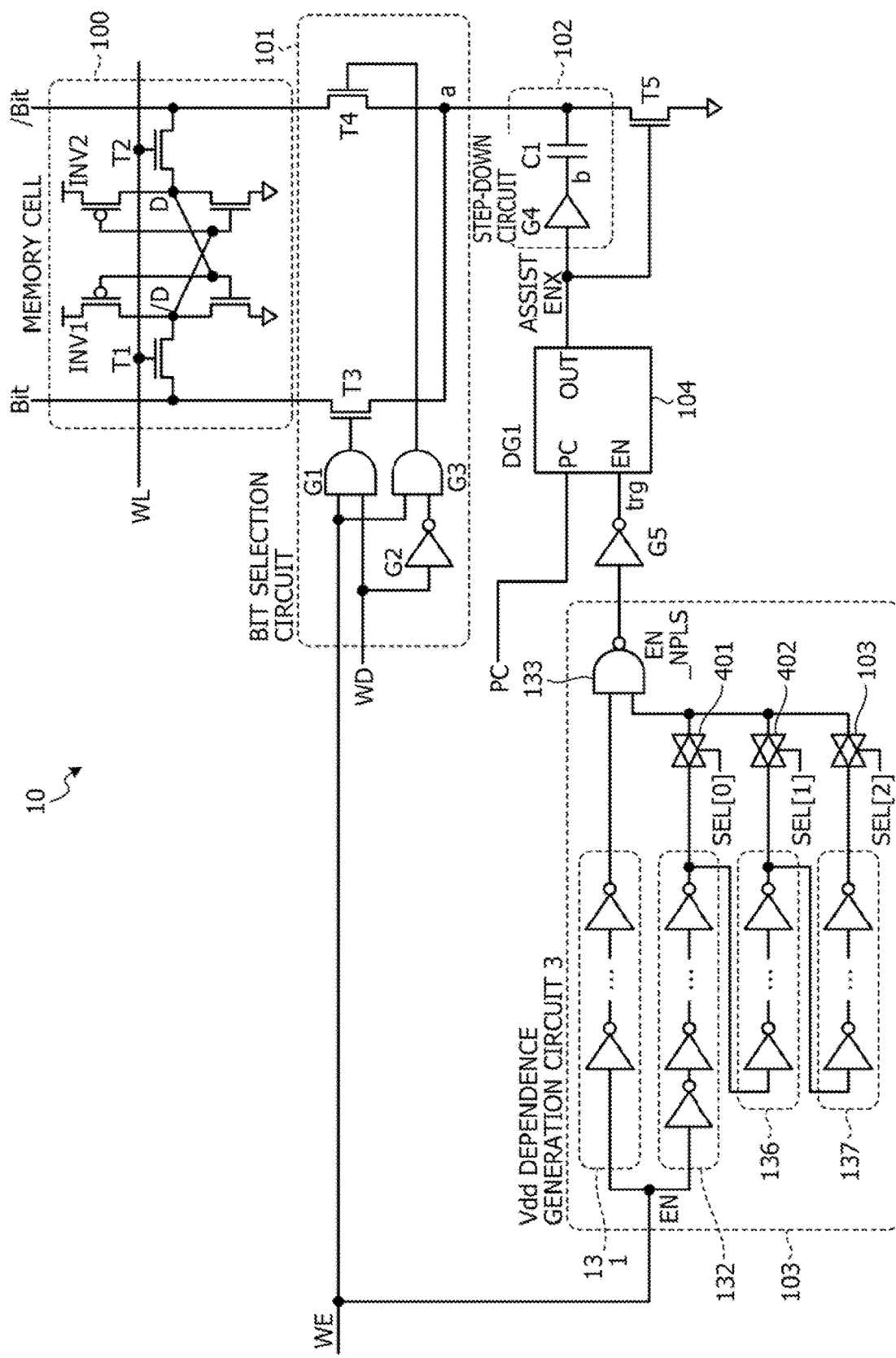
FIG. 15 is a configuration diagram of an SRAM according to Embodiment 4.

FIG. 15 is a configuration diagram of the SRAM according to Embodiment 4. FIG. 15 is an example in which the number of stages in the inverter chain 132 having the large voltage dependence is adjusted in three levels. The Vdd dependence generation circuit 103 according to the present embodiment includes inverter chains 136 and 137 in addition to the inverter chains 131 and 132. Each of the inverter chains 136 and 137 is an example of a "fourth inverter". The Vdd dependence generation circuit 103 also includes selectors 401 to 403. The Vdd dependence generation circuit 103 also includes the NAND circuit 133.

Figure 16:
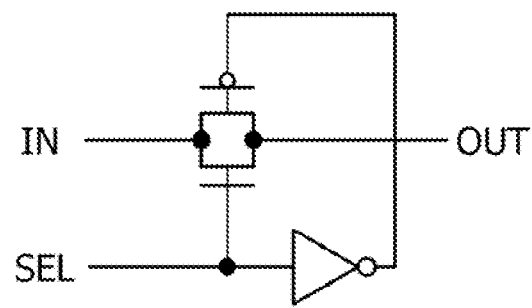
FIG. 16 is a circuit diagram of selectors.

FIG. 16 is a circuit diagram of the selectors. Each of the selectors 401 to 403 is in a conductive state when a signal inputted in to an SEL terminal is H, and is in a cut-off state when the signal is L. For example, the inputs into the SEL terminals of the selectors 401 to 403 may be, as signals, SEL[0:2] that are 3-bit signals. In this case, the SEL[0:2] signals in which the input to the selector corresponding to the stage number to be selected is H and the inputs to the other selectors are L are inputted into the selectors 401 to 403. This switches the width of the negative pulse, for example, the voltage at which the negative pulse disappears, in the Vdd dependence generation circuit 103.

An example of setting the width of the negative pulse is described. Description is given assuming that, among SEL[0:2] that are 3-bit signals, a signal inputted into the selector 401 is SEL[0], a signal inputted into the selector 402 is SEL[1], and a signal inputted into the selector 403 is SEL[2]. As for the width of the negative pulse outputted from the Vdd dependence generation circuit 103, one of the selectors 401 to 403 whose SEL terminal receives H becomes conductive. The combined number of stages in the inverter chains 132 and 136 that is selected when SEL[1] is set to H is set to a value obtained based on a manufacturing variation center value. The number of stages in the inverter chain 132 that is selected when SEL[0] is set to H is smaller than the number of stages selected when SEL[1] is set to H. The number of stages in the inverter chain 137 that is selected when SEL[2] is set to H is larger than the number of stages selected when SEL[1] is set to H.

In this case, if the voltage at which the assist is canceled is deviated from the center value due to manufacturing variation and, for example, the assist is canceled at voltage at which the execution of assist is still preferable, SEL[2] is set to H to increase the pulse width. If the assist is not canceled though the assist does not have to be executed, SEL[0] is set to H to reduce the pulse width. Selecting the selectors 401 to 403 as described above allows the SRAM 10 according to the present embodiment to achieve appropriate assist even when manufacturing variation occurs.

Embodiment 5

Next, Embodiment 5 is described. Assume a case where the SRAM 10 that is described in Embodiment 4 and whose assist cancel voltage is adjustable is used. In this case, if the cancel voltage is deviated from the center value due to manufacturing variation, it is preferable to correct this deviation. Accordingly, in the present embodiment, a test is performed by using a test circuit 50 in which a replica of the SRAM 10 is mounted, and if the cancel voltage is deviated from the center value due to manufacturing variation, an adjustment amount for correcting the deviation is determined and reflected in the actual SRAM 10. In the following description, description of the function of each of the already-described parts is omitted.

Figure 17:
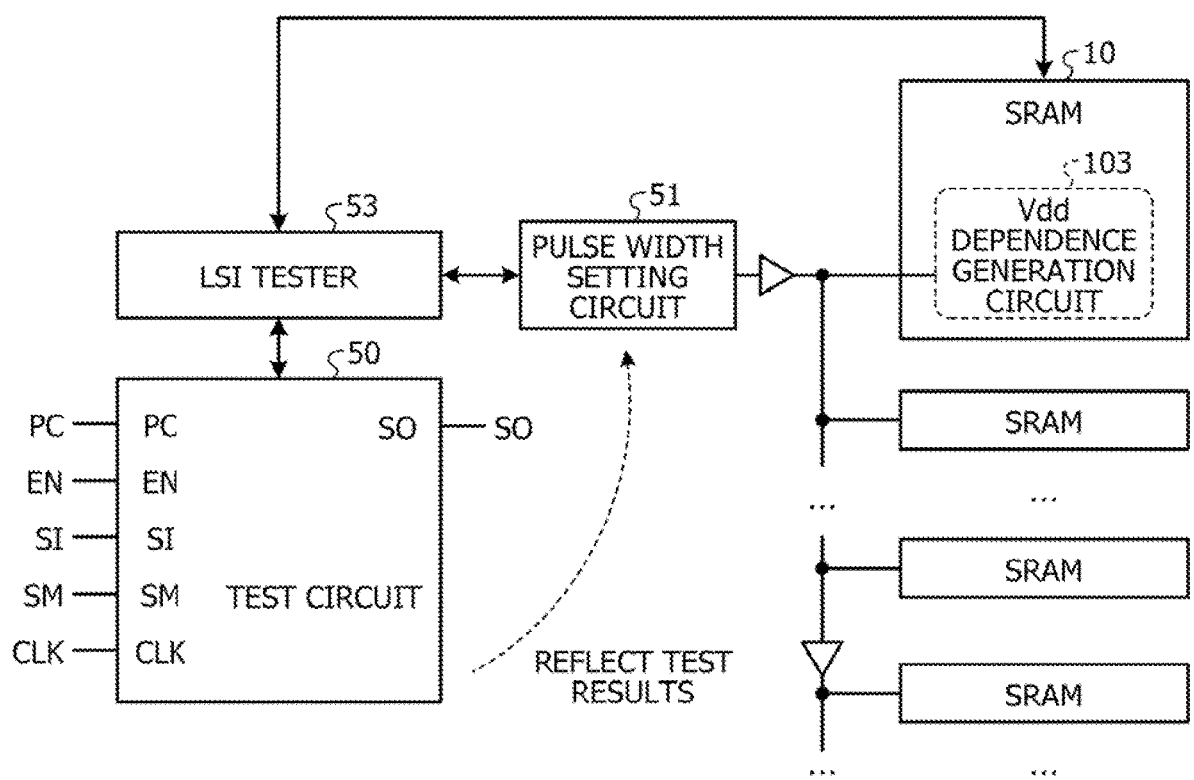
FIG. 17 is a configuration diagram including an LSI tester, a test circuit, and a pulse width setting circuit according to Embodiment 5.

FIG. 17 is a configuration diagram including an LSI tester, a test circuit, and a pulse width setting circuit according to Embodiment 5. In the present embodiment, an LSI tester 53, the test circuit 50, and a pulse width setting circuit 51 are provided. In this example, the SRAM 10 has the configuration illustrated in FIG. 15.

When the cancel voltage is deviated from the center value due to manufacturing variation in use of the SRAM 10 described in Embodiment 4, the LSI tester 53, the test circuit 50, and the pulse width setting circuit 51 adjust the timing of assist to correct this deviation. The test circuit 50 checks the deviation from the center value of the pulse disappearance voltage, for example, the assist cancel voltage of the Vdd dependence generation circuit 103 built in the SRAM 10. The pulse width setting circuit 51 stores a setting of optimal pulse width obtained from a result of a test by the test circuit 50, and distributes values of this setting to the SEL terminals of the selectors 401 to 403 in the Vdd dependence generation circuit 103 included in the SRAM 10 of FIG. 15.

The LSI tester 53 comprehensively controls various tests in the LSI 1. For example, the LSI tester 53 comprehensively controls tests related to the SRAM 10 by the test circuit 50 and the pulse width setting circuit 51.

Figure 18:
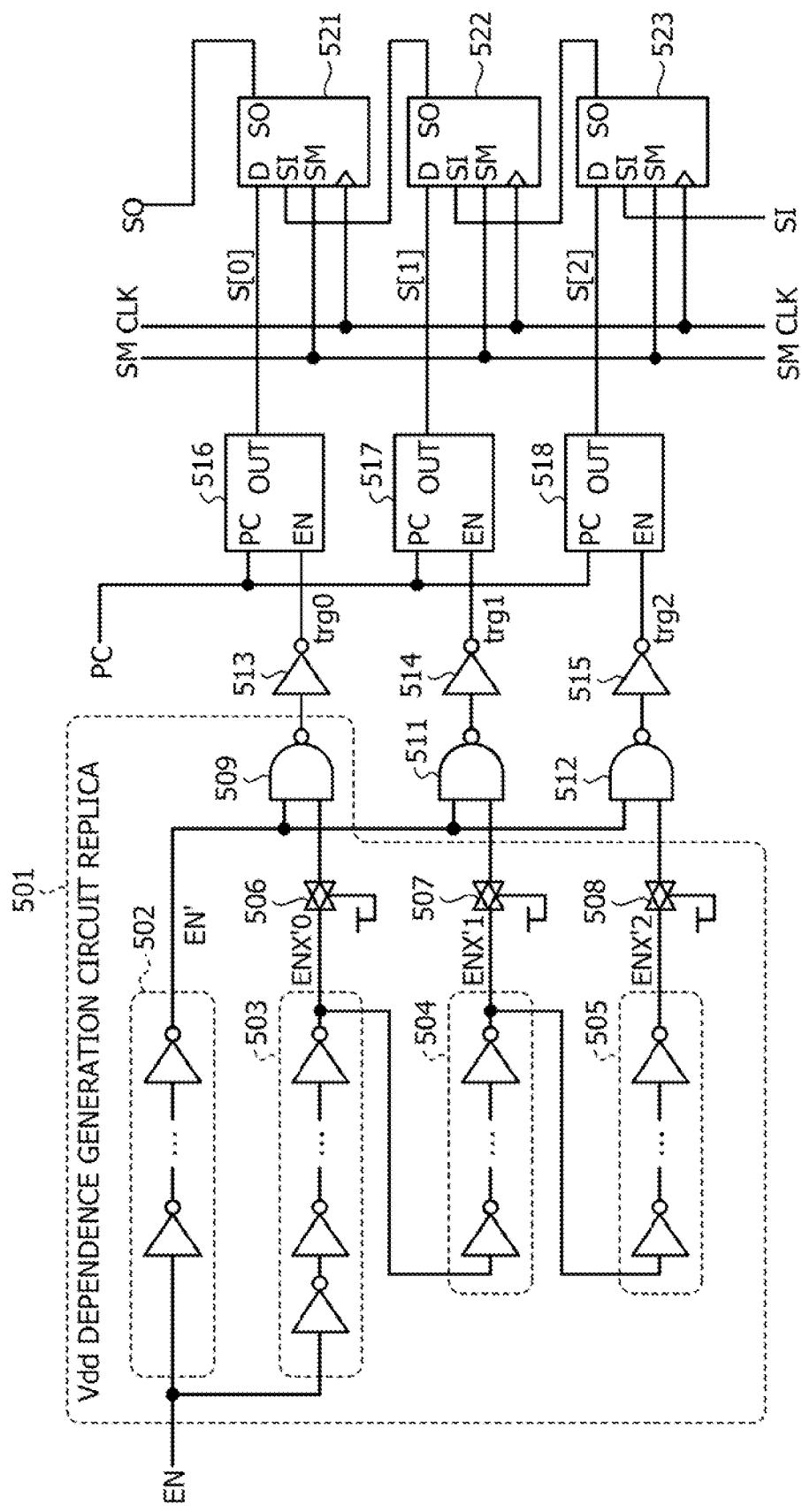
FIG. 18 is a configuration diagram of a test circuit according to Embodiment 5.

FIG. 18 is a configuration diagram of the test circuit according to Embodiment 5. As illustrated in FIG. 18, the test circuit 50 includes a Vdd dependence generation circuit replica 501 obtained by making minimum circuit modifications and minimum layout modifications associated therewith to the Vdd dependence generation circuit 103 built in the SRAM 10 illustrated in FIG. 15. Using the Vdd dependence generation circuit replica 501 may minimize deviations of the characteristics between the test circuit 50 and the Vdd dependence generation circuit 103 of the SRAM 10. The test circuit 50 includes NAND circuits 511 and 512, inverters 513 to 515, dynamic gates 516 to 518, and flip-flops 521 to 523.

The Vdd dependence generation circuit replica 501 includes an inverter chain 502 in which the voltage dependence of the delay is small and inverter chains 503 to 505 in which the voltage dependence of the delay is large. Each of the inverter chains 502, 504 and 505 has an even number of stages, and the inverter chain 503 has an odd number of stages. A signal from an EN' terminal of the inverter chain 502 determines a leading edge of a negative pulse to be generated. Signals outputted from an ENX'0 terminal, an ENX'1 terminal, and an ENX' terminal of the inverter chains 503 to 505 determine a trailing edge of the negative pulse to be generated.

The Vdd dependence generation circuit replica 501 also includes selectors 506 to 508 and a NAND circuit 509. Each of the selectors 506 to 508 has, for example, the circuit configuration illustrated in FIG. 16. The test circuit 50 including the Vdd dependence generation circuit replica 501 corresponds to an example of a "test execution unit".

In the Vdd dependence generation circuit 103 illustrated in FIG. 15, the coupling of the output terminals of the inverter chains 132, 136, and 137 is switched with the selectors 401 to 403 to input the signal into one NAND circuit 133, and one negative pulse is thereby generated. Meanwhile, in the Vdd dependence generation circuit replica 501, the EN' terminal is commonly coupled to one input terminals of the NAND circuits 509, 511, and 512. The ENX'0 terminal is coupled to the other input terminal of the NAND circuit 509, the ENX'1 terminal is coupled to the other input terminal of the NAND circuit 511, and the ENX'2 terminal is coupled to the other input terminal of the NAND circuit 512. The NAND circuits 509, 511, and 512 thereby generate three negative pulses varying in width. Desirably, the NAND circuits 509, 511, and 512 have the same shape. Outputs of the NAND circuits 509, 511, and 512 are converted to positive pulses in the inverters 513 to 515, respectively, and the positive pulses are inputted into the dynamic gates 516 to 518.

Figure 19:
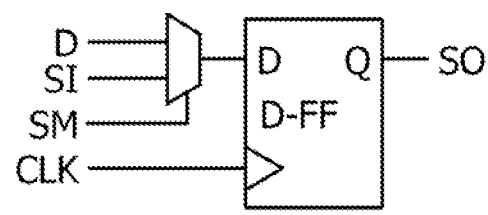
FIG. 19 is a diagram illustrating an example of a circuit configuration of a flip-flop mounted in the test circuit.

Each of the dynamic gates 516 to 518 has, for example, the circuit configuration illustrated in FIG. 9. The signals S[2:0] outputted from the dynamic gates 516 to 518 are inputted into data terminals of the flip-flops 521 to 523 that are positive-edge triggered D-type flip-flops in which a scan function is implemented. For example, the flip-flop 521 has a circuit configuration illustrated in FIG. 19. FIG. 19 is a diagram illustrating an example of the circuit configuration of the flip-flop mounted in the test circuit.

Figure 21:
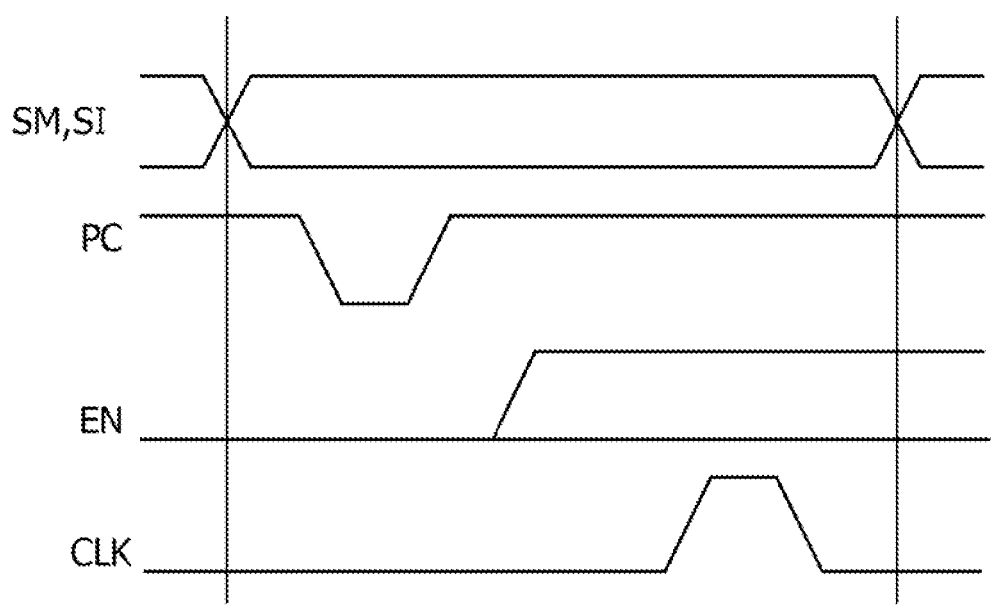
FIG. 21 is a timing chart of the test patterns in Embodiment 5.

FIG. 20 is a diagram illustrating an example of test patterns in Embodiment 5. FIG. 21 is a timing chart of the test patterns in Embodiment 5. An operation of the test circuit 50 is described with reference to FIGS. 20 and 21. In a pattern #0, the PC terminals of the dynamic gates 516 to 518 change as illustrated in FIG. 21 due to the negative pulse in the precharge line PC denoted by "N" in FIG. 20. The signals S[2:0] outputted from the dynamic gates 516 to 518 are thereby precharged to H. The signals S[2:0] precharged to H are taken in from D terminals of the respective flip-flops 521 to 523 due to positive pulses at CLK terminals of the respective flip-flops 521 to 523 denoted by "P" in FIG. 20, and are all initialized to H. Next, in a test pattern #1, the EN terminal of the inverter chain 502 in the Vdd dependence generation circuit replica 501 changes from L to H. As illustrated in FIG. 19, negative pulses are thereby generated in the outputs of the NAND circuits 509, 511, and 512 depending on the voltage. The negative pulses are inverted by the inverters 513 to 515, and are inputted into the EN terminals of the dynamic gates 516 to 518. At this time, the output of the dynamic gate in which the pulse is generated among the dynamic gates 516 to 518 change from H to L. Results of the pulse generation from the dynamic gates 516 to 518 are taken in by the respective flip-flops 521 to 523 illustrated in FIG. 21 due to the positive pulses at the CLK terminals of the respective flip-flops 521 to 523. Next, in patterns #2 and #3, SM terminals of the respective flip-flops 521 to 523 are set to 1 as illustrated in FIG. 21, and the flip-flops 521 to 523 are set to a scan shift mode. Each time the positive pulses are inputted into the CLK terminals, the flip-flops 521 to 523 sequentially output the taken-in results of pulse generation from SO terminals. Repeating the above test while changing the voltage allows the test circuit 50 to obtain the number of stages in the inverter chains 503 to 505 at which the negative pulse outputted by the Vdd dependence generation circuit replica 501 disappears. For example, the test circuit 50 may obtain a correlation between the voltage and the setting of SEL[2:0] in the selectors 506 to 508.

FIG. 22 is a diagram illustrating an example of test results in Embodiment 5. FIG. 22 illustrates a table of values of the signals S[2:0] outputted from the dynamic gates 516 to 518 when a range of measurement voltage from minimum voltage Vmin to Vmax is divided into nine levels of V [0:8] and the test pattern #1 is run at each voltage level, the sets of values for the respective voltage levels arranged in ascending order of voltage. In the table of FIG. 22, an output L indicates that a pulse has been generated, and an output H indicates that no pulse has been generated. The maximum voltage at which execution of assist is preferable is a standard value presented by a semiconductor manufacturer based on manufacturing variation and the number of mounted memory cells 100. In this example, the maximum voltage at which execution of assist is preferable is set to the value V[2] two steps above Vmin. For example, a range 541 is a voltage range in which execution of assist is preferable. The minimum voltage at which no assist is executed is set to a value obtained by subtracting the potential difference by which the bit line Bit is stepped down from Vss by the assist, from the maximum rated voltage that is a specification of the semiconductor manufacturer. In this example, the minimum voltage at which no assist is executed is set to the value V[6] two steps below Vmax. For example, a range 542 is a voltage range in which no assist is executed.

In this case, such a setting that the test results are L in the voltage range V[2:0] and are H in the voltage range V[8:6] is preferable as the setting for executing the assist. In this example of test results, the signals S[0] and S[1] satisfy this condition. Since power consumption and stress on the element are smaller in the case where the cancel of the assist with the voltage increase is performed earlier, the signal S[0] is the optimal condition. Accordingly, in this example of test result, setting SEL[0] to H is optimal for the signals to be inputted into the selectors 401 to 403 of the Vdd dependence generation circuit 103.

Figure 23:
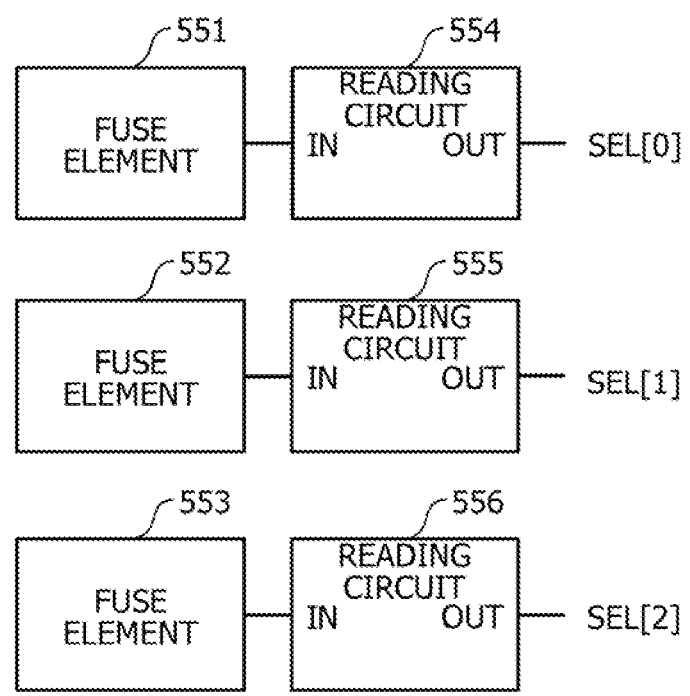
FIG. 23 is a configuration diagram illustrating an example of the pulse width setting circuit.

FIG. 23 is a configuration diagram illustrating an example of the pulse width setting circuit. In the pulse width setting circuit 51 according to the present embodiment, each of FUSE elements 551 to 553 and a corresponding one of reading circuits 554 to 556 form a group, and the pulse width setting circuit 51 includes as many groups as the number of selection signals of the selectors 401 to 403 of the Vdd dependence generation circuit 103 illustrated in FIG. 15. Since the Vdd dependence generation circuit 103 illustrated in FIG. 15 performs selection with 3 bits of SEL[2:0] that are signals inputted into the selectors 401 to 403, an example for 3 bits will be described in this section. The setting, obtained by the test circuit 50, of SEL[2:0] that are signals to be inputted into the Vdd dependence generation circuit 103 is written into the FUSE elements 551 to 553. Each of the reading circuits 554 to 556 outputs H when the corresponding one of coupled FUSE elements 551 to 553 is broken by the writing of the setting, and outputs L when the corresponding one of coupled FUSE elements 551 to 553 is not broken. For example, laser fuses, electric fuses, or the like are used as the FUSE elements 551 to 553. For example, the reading circuits 554 to 556 include circuits that determine presence or absence of breakage by causing currents to flow through the FUSE elements 551 to 553 for a short period just after power on, and store results of the determination in latches, or the like.

Figure 24:
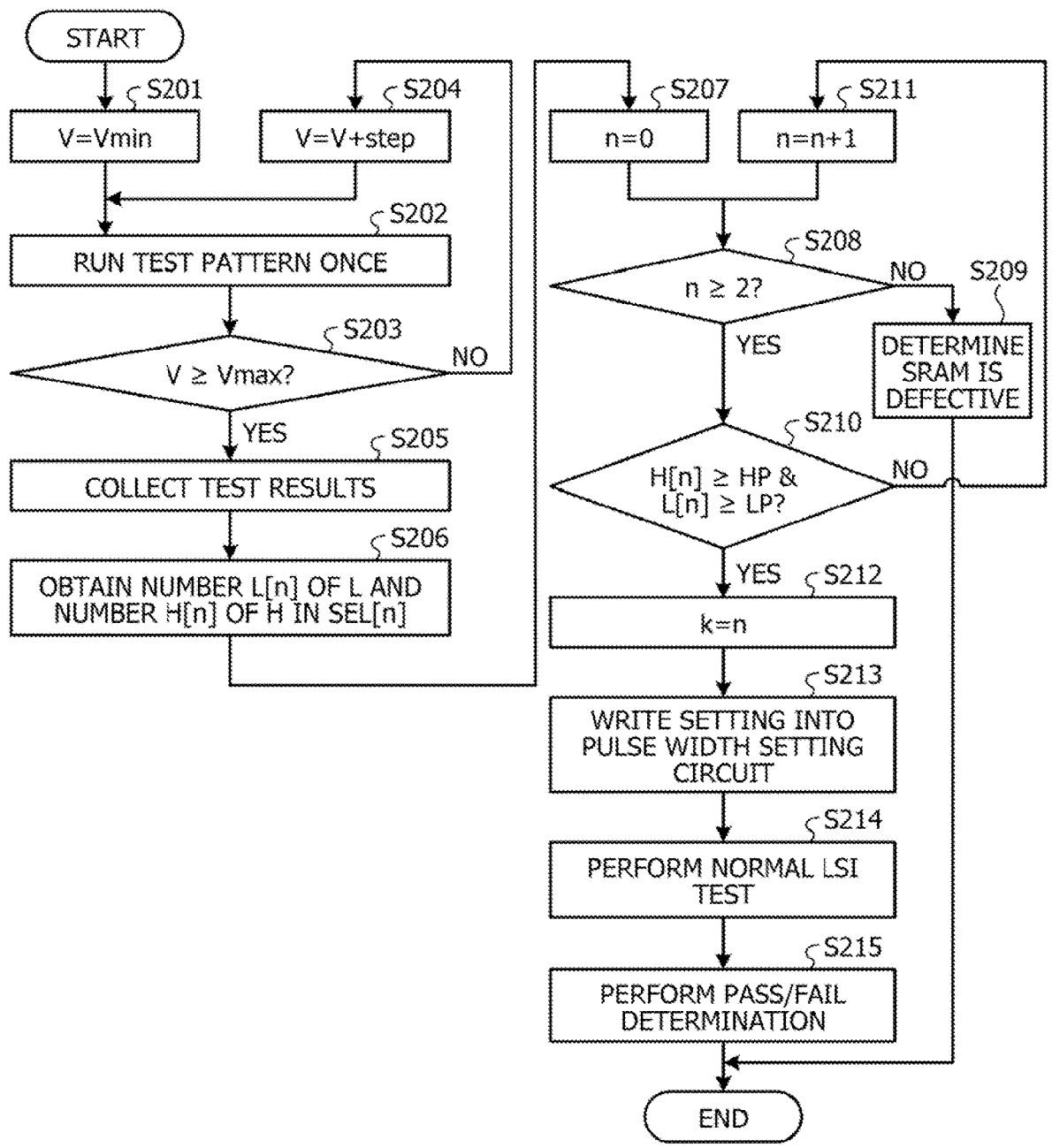
FIG. 24 is a flowchart of operations of the test circuit and the pulse width setting circuit according to Embodiment 5.

FIG. 24 is a flowchart of operations of the test circuit and the pulse width setting circuit according to Embodiment 5. A flow of the operations of the test circuit 50 and the pulse width setting circuit 51 according to the present embodiment is described next with reference to FIG. 24. The case where the Vdd dependence generation circuit 103 performs selection with 3 bits of SEL[2:0] that are signals inputted into the selectors 401 to 403 is described as an example. Hereinafter, the signal of each bit is represented by S[n] (n=0, 1, or 2).

At the start of the test, the LSI tester 53 sets the voltage V of the power supply to Vmin (step S201).

The test circuit 50 then runs, for example, the predetermined test pattern illustrated in FIG. 18 once (step S202).

Next, the LSI tester 53 determines whether or not the voltage V of the power supply is Vmax or higher (step S203). When the voltage V is below Vmax (step S203: No), the LSI tester 53 steps up the voltage V of the power supply by a predetermined step (V=V+step) (step S204). The processing then returns to step S202.

Meanwhile, when the voltage V is Vmax or higher (step S203: Yes), the LSI tester 53 collects the test results and obtains the test results as illustrated in FIG. 20 (step S205).

Next, the LSI tester 53 obtains the number L[n] of L and the number H[n] of H in SEL[n] (step S206). For example, the LSI tester 53 stores the number of pulses generated in each output, for example, the number of outputs of L in each signal S[n], across all voltage levels V, as a variable L[n] on a tester program. The LSI tester 53 also stores the number of times the pulse is not generated, for example, the number of outputs of H, as a variable H[n] on the tester program.

Appropriate pulse conditions are H[n]≥HP and L[n]≥LP, where LP is the number of steps of the voltage range in which execution of assist is preferable as illustrated in the range 541 of FIG. 20, and HP is the number of steps of the voltage range in which no assist is executed as illustrated in the range 542.

The LSI tester 53 sets n=0 (step S207). Next, the LSI tester 53 determines whether or not n is 2 or smaller (step S208). When n is larger than 2 (step S208: No), the LSI tester 53 determines that the tested SRAM 10 is defective (step S209), and terminates the test.

Meanwhile, when n is 2 or smaller (step S208: Yes), the LSI tester 53 determines whether or not H[n]≥HP and L[n]≥LP are satisfied (step S210). When at least one of conditions of H[n] being smaller than HP and L[n] being smaller than LP is satisfied (step S210: No), the LSI tester 53 increments n by one (step S211), and returns to step S208.

Meanwhile, when H[n]≥HP and L[n]≥LP are satisfied (step S210: Yes), the LSI tester 53 determines that the optimal width of the negative pulse is achieved with S[n] at that point, and sets k=n by setting S[k] to be set to H to S[n] at that point (step S212).

Next, the LSI tester 53 performs writing to the pulse width setting circuit 51 such that S[k] is set to H (step S213). One of the fuse elements 551 to 553 in the pulse width setting circuit 51 corresponding to S[k] is thereby broken. The optimal pulse width is thus set for the Vdd dependence generation circuit 103 of the SRAM 10.

The LSI tester 53 then performs a normal LSI test (step S214). The LSI tester 53 performs pass/fail determination of the SRAM 10 for which the setting has been performed, based on test results (step S215).

As described above, the test circuit and the pulse width setting circuit according to the present embodiment determine the optimal pulse width for the SRAM by using the replica of the Vdd dependence generation circuit mounted in the SRAM, and determine the input of signals to the selectors such that the determined pulse width is set. Accordingly, it is possible to automatically correct the assist cancel voltage to the optimal voltage without concerning about the deviation of the assist cancel voltage from the center value due to manufacturing variation.

Embodiment 6

Next, Embodiment 6 is described. In Embodiment 5, the standard value presented by the semiconductor manufacturer based on the number of mounted memory cells 100 and the manufacturing variation is used as the maximum voltage at which the execution of assist is preferable. This standard value includes a margin to cover variation of a final center of the memory cell 100, and the assist is excessive depending on an actual final center value of the memory cell 100. Accordingly, it is more preferable to use setting that matches the actual finish of the memory cell 100 for the assist.

Figure 25:
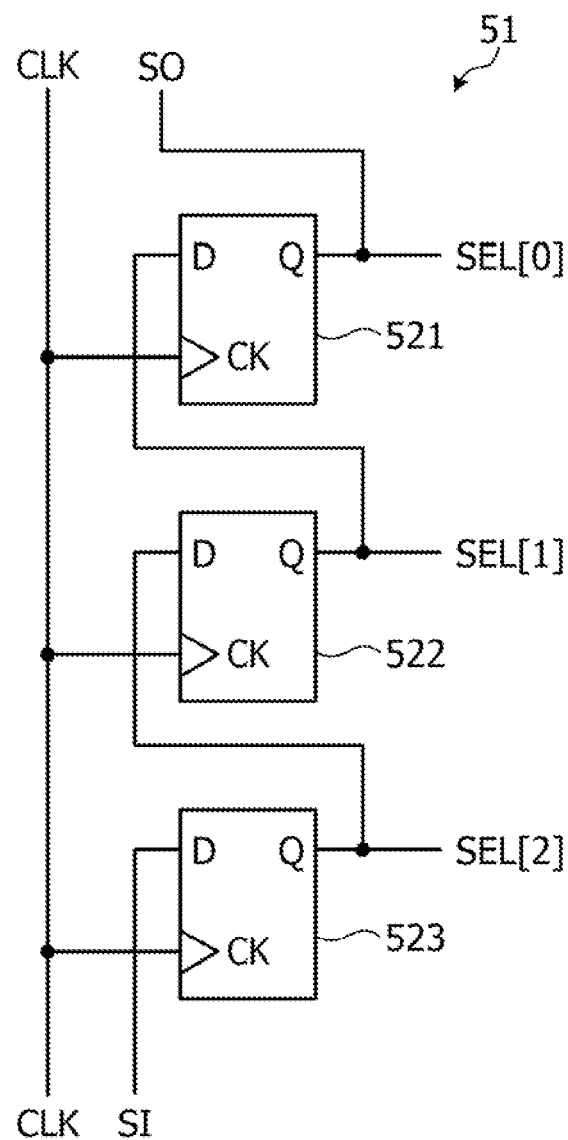
FIG. 25 is a configuration diagram of a pulse width setting circuit according to Embodiment 6.

The pulse width setting circuit 51 according to the present embodiment is different from that in Embodiment 5 in that the pulse width of the Vdd dependence generation circuit 103 of the SRAM 10 may be changed by scan shift. FIG. 25 is a configuration diagram of the pulse width setting circuit according to Embodiment 6. In the following description, description of the function of each of the already-described parts is omitted.

In the pulse width setting circuit 51, outputs of the flip-flops 521 to 523, corresponding to SEL[2:0] that are the signals inputted into the selectors 401 to 403 of the Vdd dependence generation circuit 103 illustrated in FIG. 15, are coupled as follows. The output of the flip-flop 523 is coupled to an input of the flip-flop 522, and the output of the flip-flop 522 is coupled to an input of the flip-flop 521. Accordingly, every time the positive pulse is inputted into the CK terminal, data inputted from the SI terminal is stored in the flip-flop 523, the flip-flop 522, and the flip-flop 521 in this order by scan shift.

Figure 26:
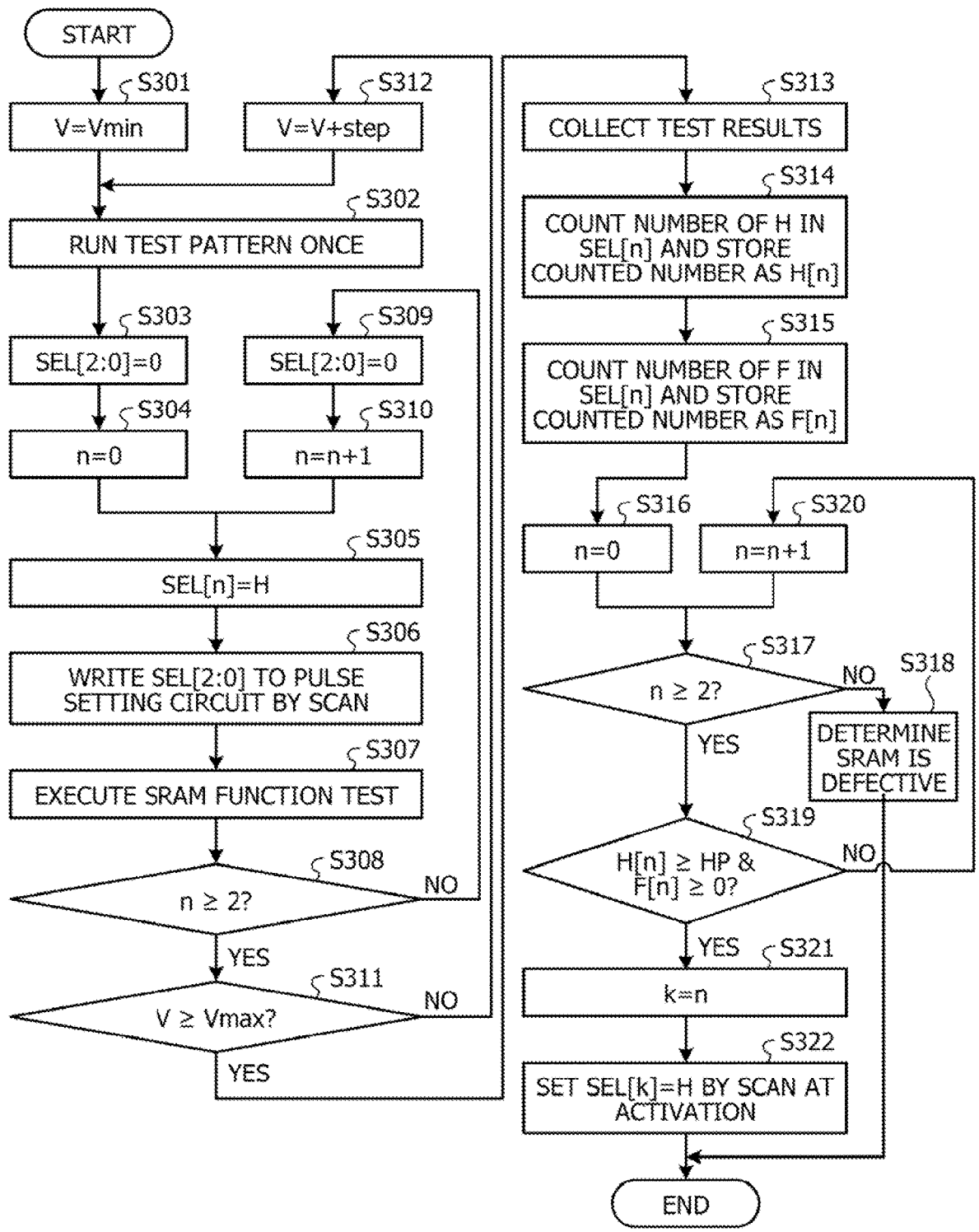
FIG. 26 is a flowchart of operations of a test circuit and the pulse width setting circuit according to Embodiment 6.

FIG. 26 is a flowchart of operations of a test circuit and the pulse width setting circuit according to Embodiment 6. A flow of the operations of the test circuit 50 and the pulse width setting circuit 51 according to the present embodiment is described next with reference to FIG. 26. The case where the Vdd dependence generation circuit 103 performs selection with 3 bits of SEL[2:0] that are signals inputted into the selectors 401 to 403 is described as an example. Hereinafter, the signal of each bit is represented by S[n] (n=0, 1, or 2).

At the start of the test, the LSI tester 53 sets the voltage V of the power supply inputted into the test circuit 50 to Vmin (step S301).

The test circuit 50 then runs, for example, the predetermined test pattern illustrated in FIG. 18 once (step S302).

The pulse width setting circuit 51 performs initialization by setting SEL[2:n] of the Vdd dependence generation circuit 103 built in the SRAM 10 to 0 (step S303).

The test circuit 50 then sets n in SEL[n] to 0 (step S304).

The test circuit 50 then sets SEL[n] to H (step S305).

Next, the test circuit 50 writes SEL[2:0] to the pulse width setting circuit 51 by scan (step S306). A signal in which SEL[n] is set to H is thereby inputted in SEL[2:n] of the Vdd dependence generation circuit 103 built in the SRAM 10.

The LSI tester 53 then executes an SRAM function test of the SRAM 10 (step S307).

The test circuit 50 determines whether n is equal to or greater than 2 which is the maximum number (step S308). When n is smaller than 2 (step S308: No), the pulse width setting circuit 51 performs initialization by setting SEL[2:n] of the Vdd dependence generation circuit 103 built in the SRAM 10 to 0 (step S309).

Next, the test circuit 50 increments n in SEL[n] by one (step S310). The test circuit 50 then returns to step S305.

Meanwhile, when n is 2 or larger (step S308: Yes), the test circuit 50 determines whether or not the voltage V of the power supply is Vmax or higher (step S311). When the voltage V is below Vmax (step S311: No), the LSI tester 53 steps up the voltage V of the power supply by a predetermined step (V=V+step) (step S312). The processing then returns to step S302.

Meanwhile, when the voltage V is Vmax or higher (step S311: Yes), the test circuit 50 collects the test results (step S313). FIG. 27 is a diagram of an example of the test results obtained in Embodiment 6. For example, the test circuit 50 obtains a test result 601 and an SRAM function test result 602 obtained by running the test pattern as illustrated in FIG. 27. As illustrated in FIG. 27, the test result 601 obtained by running the test pattern is similar to the test result obtained in Embodiment 5. A range 603 in the test result 601 is a voltage range in which no assist is executed. Meanwhile, the SRAM function test result 602 illustrates information collected for each voltage step in which a result of determination of whether or not the function of the SRAM 10 in each pulse width setting has normally operated is represented by P (pass) in the case where the function has normally operated and by F (fail) in the case where the function has failed to operate. In this case, the pulse width for which F is registered in the SRAM function test result 602 is not suitable for use.

Conditions for an appropriate pulse width obtained from the test results in FIG. 27 are such conditions that the function of the SRAM 10 operates normally at all voltage steps, and no pulse is generated in the voltage range in which no assist is executed. In the case of FIG. 27, signals that satisfy these conditions are the signals S[1] and S[2]. Out of these signals, the signal S[1] having a narrow pulse width is optimal from the viewpoint of reducing power and stress to the memory cell 100. The LSI tester 53 thus executes calculation for obtaining the optimal pulse width as described below.

Next, the LSI tester 53 counts the number of times no pulse is generated in each output, for example, the number of H in each SEL[n] in the test result 601, across all voltage levels from the test results obtained by the test circuit 50, and stores the number as H[n] (step S314).

The LSI tester 53 counts the number of F in SEL[n] in the SRAM function test result 602, and stores the number as F[n] (step S315).

When the number of voltage steps in which no assist is executed is represented by HP as in Embodiment 5, the appropriate pulse conditions are H[n]≥HP and F[n]=0. In the case of FIG. 25, HP is 3. When there are a plurality of n satisfying these conditions, n with the smallest pulse width is optimal. Such n may be obtained by performing the determination from n=0 and selecting n satisfying the conditions first.

The LSI tester 53 sets n=0 (step S316).

Next, the LSI tester 53 determines whether or not n is 2 or smaller (step S317). When n is larger than 2 (step S317: No), the LSI tester 53 determines that the tested SRAM 10 is defective (step S318), and terminates the test.

Meanwhile, when n is 2 or smaller (step S317: Yes), the LSI tester 53 determines whether or not H[n]≥HP and F[n]≥0 are satisfied (step S319). When at least one of conditions of H[n] being smaller than HP and F[n] being smaller than 0 is satisfied (step S319: No), the LSI tester 53 increments n by one (step S320), and returns to step S317.

Meanwhile, when H[n]≥HP and F[n]≥0 are satisfied (step S319: Yes), the LSI tester 53 determines that the optimal width of the negative pulse is achieved with S[n] at that point, and sets k=n by setting S[k] to be set to H to S[n] at that point (step S321).

At the activation of the LSI 1, the pulse width setting circuit 51 sets SEL[k]=H in the Vdd voltage dependent circuit 103 of the SRAM 10 by scan (step S322). For example, a value of SEL[2:0] that gives the obtained optimal pulse width is stored in a read-only memory (ROM) or the like outside the LSI 1, and is sent to the pulse width setting circuit 51 by a joint test action group (JTAG) or the like at the power on to perform the setting.

As described above, according to the method of Embodiment 6, it is possible to match the voltage at which execution of assist is preferable to the capability of the actual memory cell, instead of the standard value presented by the semiconductor manufacturer and including the margin. As a result, the power and the stress on the memory cell due to the assist may be thus suppressed to the minimum.

According to the method of the present embodiment, it is possible to test the SRAM while changing the voltage at which the assist is canceled. Accordingly, the setting matching the actual finish of the memory cell may be achieved. As a result, it is possible to set voltage at which power is saved most and the stress applied to the memory cell is minimized, as the voltage at which the assist is canceled.

Embodiment 7

Figure 28:
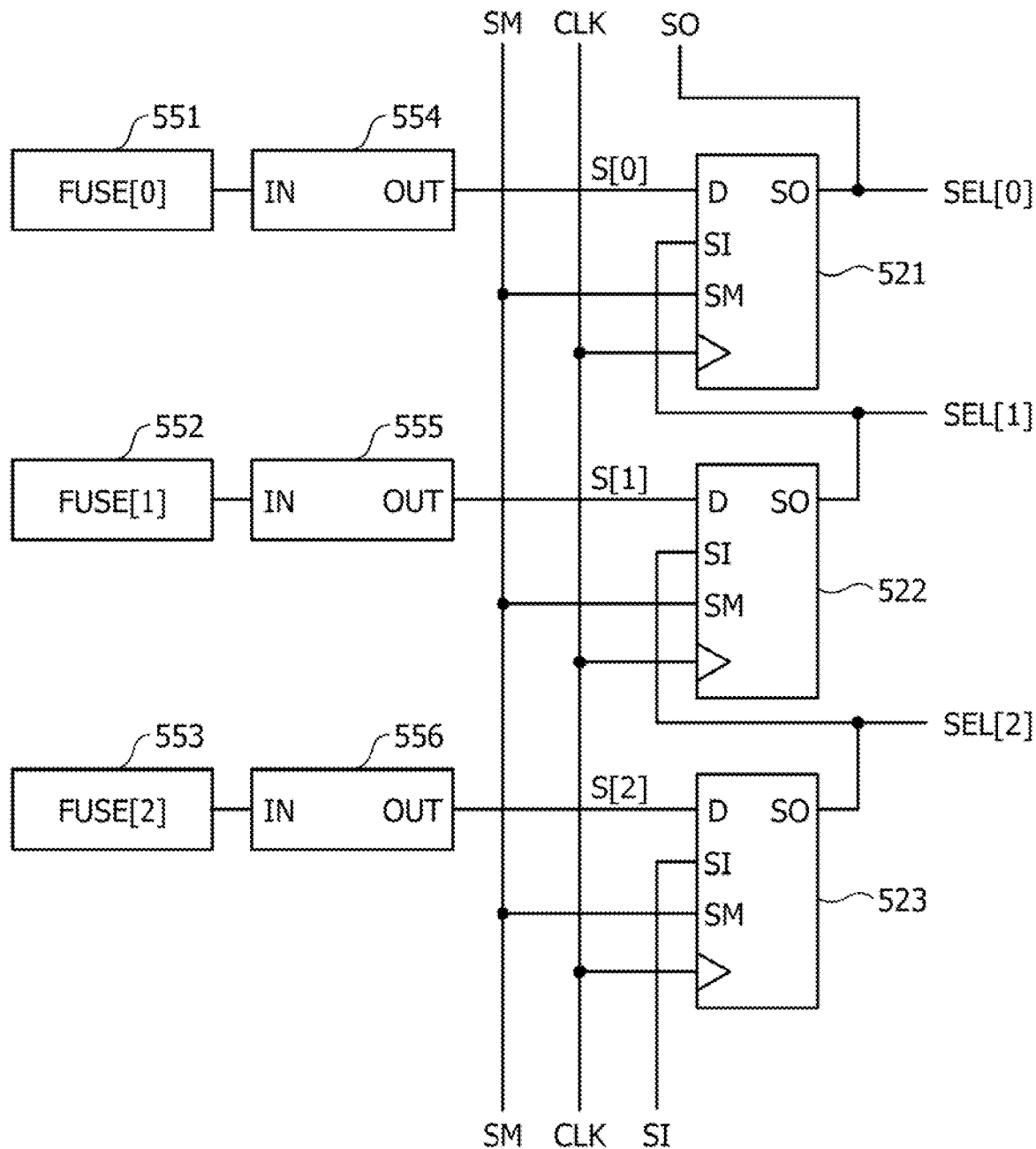
FIG. 28 is a configuration diagram of a pulse width setting circuit according to Embodiment 7.

Next, Embodiment 7 is described. FIG. 28 is a configuration diagram of a pulse width setting circuit according to Embodiment 7. A test circuit 50 according to the present embodiment is similar to the test circuit 50 illustrated in FIG. 18.

In the pulse width setting circuit 51, each of the FUSE elements 551 to 553, a corresponding one of the reading circuits 554 to 556, and a corresponding one of the flip-flops 521 to 523 form a group, and the pulse width setting circuit 51 includes as many groups as the number of selection signals of the selectors 401 to 403 of the Vdd dependence generation circuit 103 illustrated in FIG. 15.

The flip-flops 521 to 523 are positive-edge triggered D-type flip-flops in which a scan function is implemented. Output terminals of the reading circuits 554 to 556 are coupled to data input terminals of the flip-flops 521 to 523.

When the SM terminals of the flip-flops 521 to 523 are L, the flip-flops 521 to 523 obtain data read from the FUSE elements 551 to 553. When the SM terminals of the flip-flops 521 and 522 are H, each of the flip-flops 521 and 522 takes in the output of the flip-flop 522 or 523 of the previous stage by scan shift.

Figure 29:
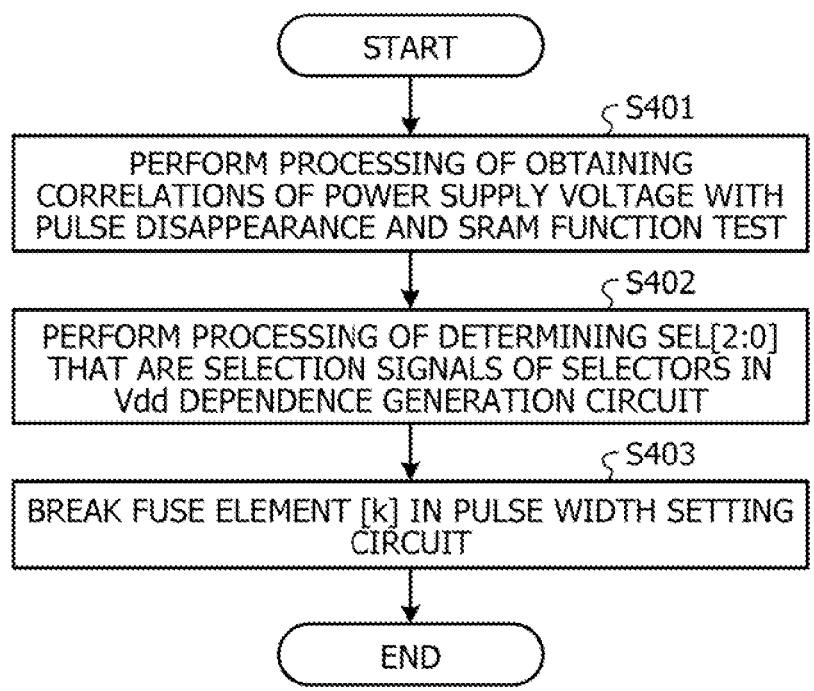
FIG. 29 is a flowchart of operations of a test circuit and the pulse width setting circuit according to Embodiment 7.

FIG. 29 is a flowchart of operations of the test circuit and the pulse width setting circuit according to Embodiment 7. A flow of the operations of the test circuit 50 and the pulse width setting circuit 51 according to the present embodiment are described next with reference to FIG. 29.

The LSI tester 53, the test circuit 50, and the pulse width setting circuit 51 execute processing of obtaining correlations of the power supply voltage with the pulse disappearance and the SRAM function test (step S401). For example, the LSI tester 53, the test circuit 50, and the pulse width setting circuit 51 execute the processing of steps S301 to S311 in the flow illustrated in FIG. 26 as specific processing corresponding to the processing of obtaining the correlations.

Next, the LSI tester 53, the test circuit 50, and the pulse width setting circuit 51 execute processing of determining SEL[2:0] that are the selection signals of the selectors 401 to 403 of the Vdd dependence generation circuit 103 (step S402). For example, the LSI tester 53, the test circuit 50, and the pulse width setting circuit 51 execute the processing of steps S313 to S321 in the flow illustrated in FIG. 26 as specific processing corresponding to the processing of determining SEL[2:0].

The pulse width setting circuit 51 then breaks the fuse element [k] corresponding to SEL[k] determined to be H among the fuse elements 551 to 553 (step S403).

According to the method of the present embodiment, it is possible to reflect the results of the SRAM function test performed for all pulse width settings and determine the optimal pulse width depending on the manufacturing variation. According to the method of the present embodiment, writing the determination result of the optimal pulse width to the FUSE element allows omitting of loading of the setting from an external ROM or the like at the time of system operation, and the operation cost may be suppressed.

Embodiment 8

Figure 30:
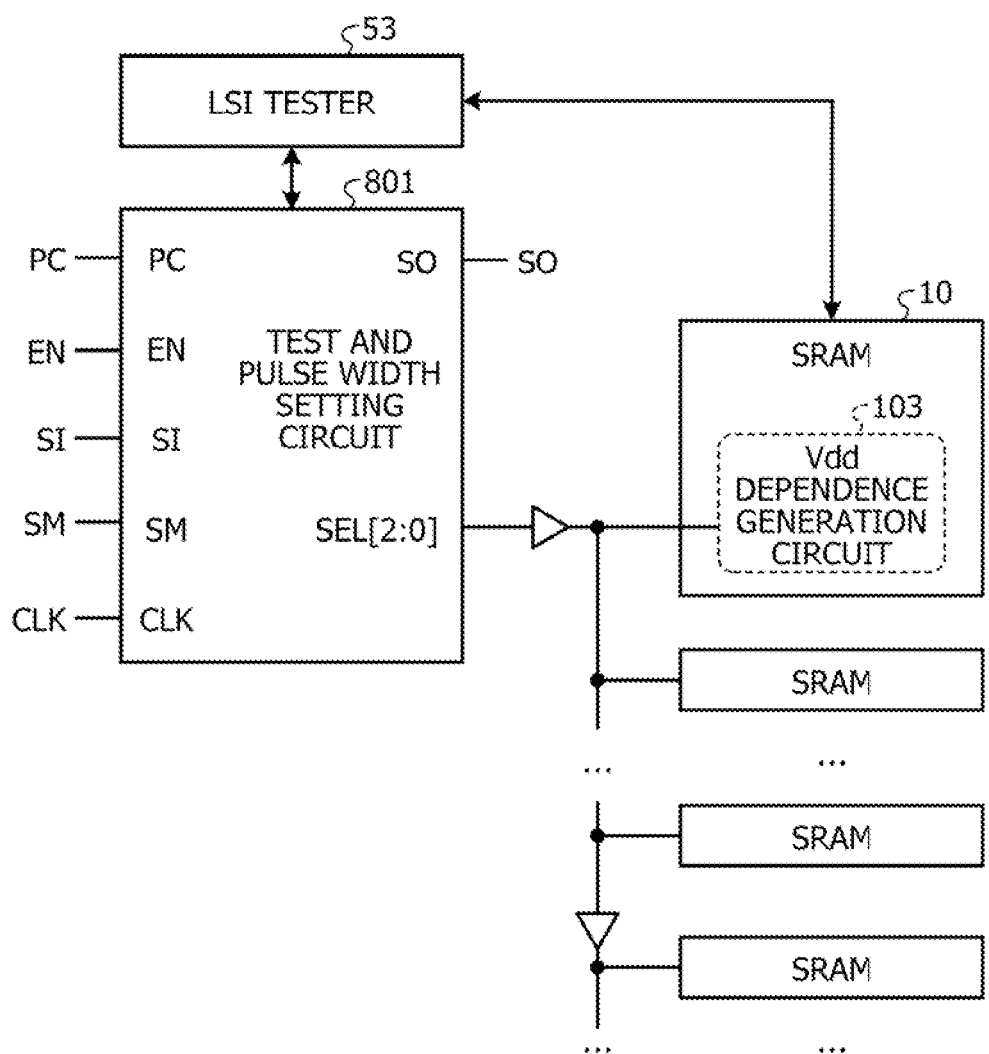
FIG. 30 is a configuration diagram including a test circuit and a pulse width setting circuit according to Embodiment 8.

Next, Embodiment 8 is described. FIG. 30 is a configuration diagram including a test circuit and a pulse width setting circuit according to Embodiment 8. In the present embodiment, the SRAM 10 illustrated in FIG. 15 is used in which the voltage at which the assist is canceled is adjustable, and the voltage at which the assist is canceled is set based on the results of the SRAM function test. In the present embodiment, a test and pulse width setting circuit 801 is provided.

Figure 31:
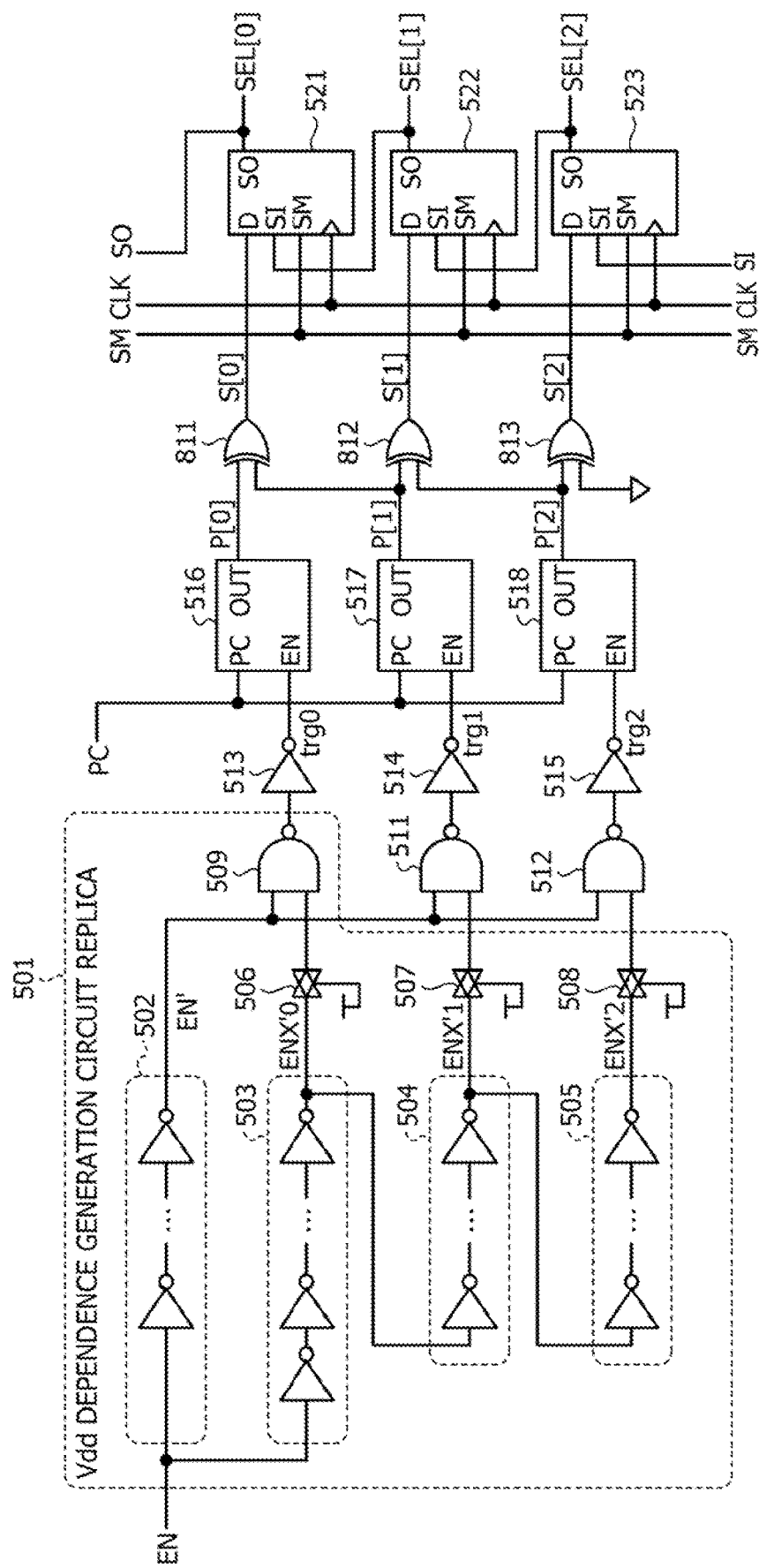
FIG. 31 is a configuration diagram of a test and pulse width setting circuit.

FIG. 31 is a configuration diagram of the test and pulse width setting circuit. The test and pulse width setting circuit 801 detects a setting in which the negative pulse generated in the Vdd dependence generation circuit 103 built in the SRAM 10 disappears at each voltage level, and holds the detected setting. The test and pulse width setting circuit 801 sets the held setting as SEL[2:0] that are the signals for selecting the selectors 401 to 403 of the Vdd dependence generation circuit 103 built in each SRAM 10.

The test and pulse width setting circuit 801 includes the Vdd dependence generation circuit replica 501, the NAND circuits 511 and 512, the inverters 513 to 515, the dynamic gates 516 to 518, XOR circuits 811 to 813, and the flip-flops 521 to 523. The Vdd dependence generation circuit replica 501, the NAND circuits 511 and 512, the inverters 513 to 515, and the dynamic gates 516 to 518 perform operations similar to those in Embodiment 5.

One input terminals of the XOR circuits 811 to 813 are coupled to output terminals of the dynamic gates 516 to 518, respectively. The other input terminal of the XOR circuit 811 is coupled to the output terminal of the dynamic gate 517. The other input terminal of the XOR circuit 812 is coupled to the output terminal of the dynamic gate 518. The other input terminal of the XOR circuit 813 is coupled to Vss.

The XOR circuit 811 outputs a signal S[0] that is an exclusive OR of signals P[0] and P[1] outputted from the dynamic gates 516 and 517. The XOR circuit 812 outputs a signal S[1] that is an exclusive OR of signals P[1] and P[2] outputted from the dynamic gates 517 and 518. The XOR circuit 813 outputs a signal S[2] that is an exclusive OR of Vss and the signal P[2] outputted from the dynamic gate 518.

The flip-flops 521 to 523 take in the signals S[2:0] outputted from the respective XOR circuits 811 to 813, respectively.

Figure 33:
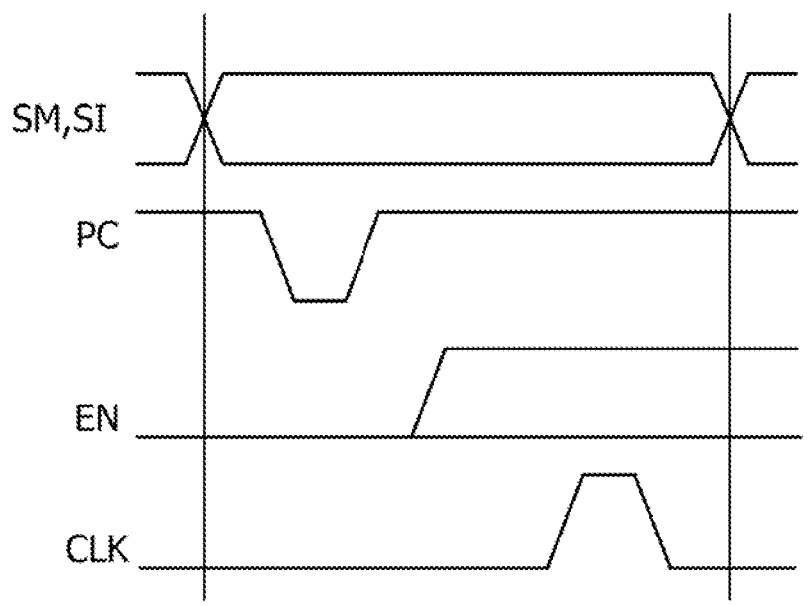
FIG. 33 is a timing chart of the pulse disappearance setting detection pattern.

FIG. 32 is a diagram illustrating an example of a pulse disappearance setting detection pattern. FIG. 33 is a timing chart of the pulse disappearance setting detection pattern.

The test and pulse width setting circuit 801 runs a pattern #00 in the pulse disappearance setting detection pattern 820 to clear the flip-flops 521 to 523 to 1. Next, the test and pulse width setting circuit 801 runs a pattern #01 in the pulse disappearance setting detection pattern 820 to generate pulses to be taken into the flip-flops 521 to 523. When each of the patterns #00 and #01 is run, in actual, the test and pulse width setting circuit 801 changes each signal at timings illustrated in FIG. 31.

FIG. 34 is a diagram illustrating changes in internal signals in the case where the pulse disappearance setting detection pattern is run. The internal signals are the signals P[2:0] outputted from the dynamic gates 516 to 518 and the signals S[2:0] outputted from the XOR circuits 811 to 813.

When the pulse disappearance setting detection pattern 820 is run while the power supply voltage is changed, the signals P[2:0] and S[2:0] change as illustrated in FIG. 34. As described above, when the pulse width is reduced from P[2] to P[0] at each voltage level, H is outputted at a change point where the pulse disappears, from one of the XOR circuits 811 to 813 corresponding to the disappearance of the pulse, and L is outputted from the other XOR circuits. For example, the test and pulse width setting circuit 801 runs the pulse disappearance setting detection pattern 820 at voltage below the voltage at which no assist is executed, and this enables setting of the voltage at which the assist is canceled for the Vdd dependence generation circuit 103 depending on the voltage at which the pulse disappears. Then, when the SRAM 10 passes the SRAM function test by the LSI tester 53, it is confirmed that there is no problem in canceling the assist at the set voltage in the SRAM 10.

Figure 35:
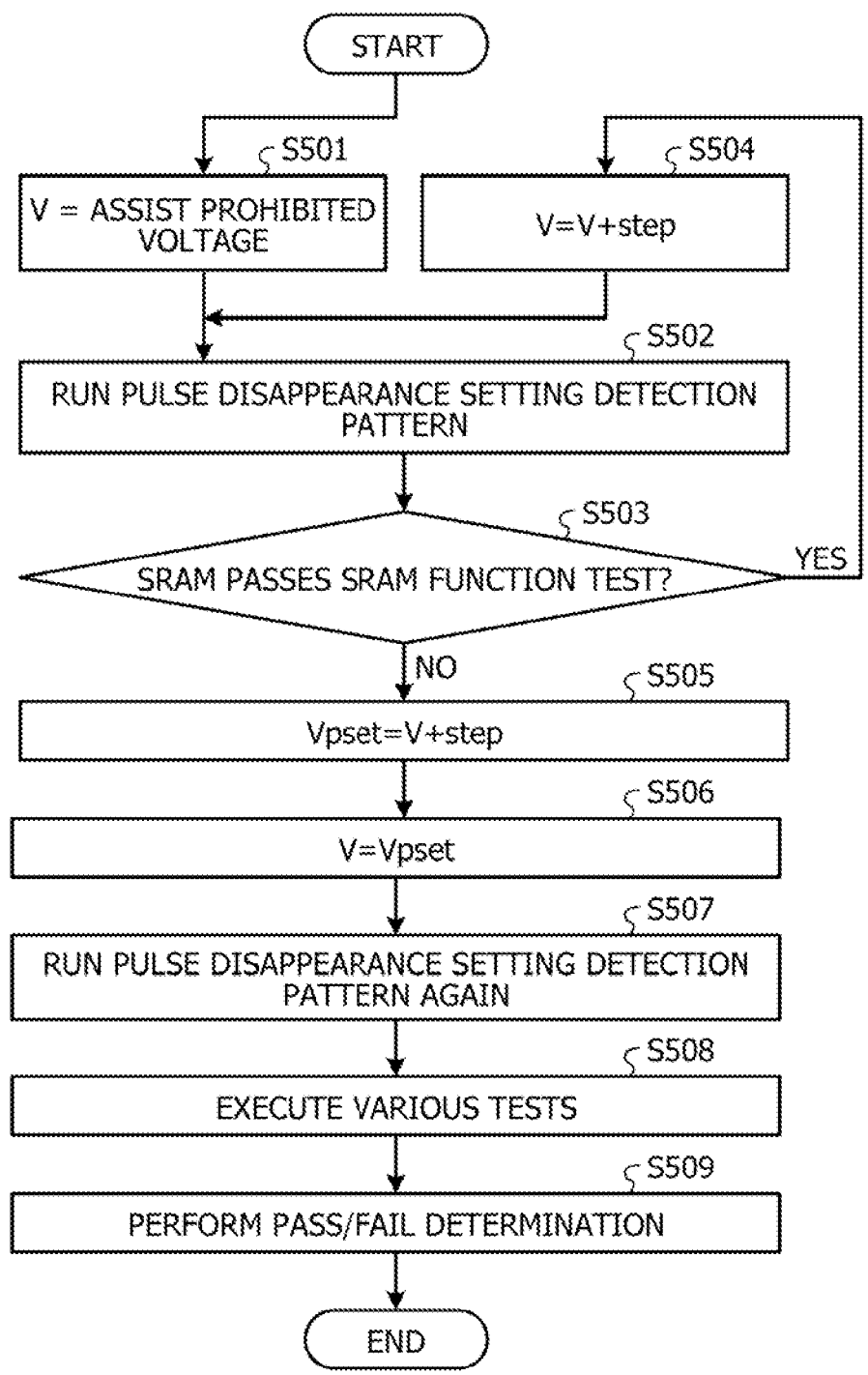
FIG. 35 is a flowchart of an operation of the test and pulse width setting circuit according to Embodiment 8.

FIG. 35 is a flowchart of an operation of the test and pulse width setting circuit according to Embodiment 8. A flow of the operation of the test and pulse width setting circuit 801 according to the present embodiment is described next with reference to FIG. 35.

At the start of the test, the LSI tester 53 sets the voltage V of the power supply to Vmin (step S501).

The test and pulse width setting circuit 801 then runs, for example, the predetermined pulse disappearance setting detection pattern 820 illustrated in FIG. 32 once (step S502). The test and pulse width setting circuit 801 thereby sets the Vdd dependence generation circuit 103 of the SRAM 10 such that the assist is canceled at the voltage V.

The LSI tester 53 executes the SRAM function test on the SRAM 10 with the cancellation of the assist at the voltage V set. The LSI tester 53 then determines whether or not the SRAM 10 passes the SRAM function test (step S503).

When the SRAM 10 passes the SRAM function test (step S503: Yes), the LSI tester 53 reduces the voltage V by voltage corresponding to a predetermined step (step S504). The processing then returns to step S502.

Meanwhile, when the SRAM 10 fails the SRAM function test (step S503: No), the LSI tester 53 sets voltage one step above the voltage V at that time, as Vpset that is optimal assist cancel voltage. For example, the LSI tester 53 sets Vpset=V+step (step S505). Next, the LSI tester 53 notifies the test and pulse width setting circuit 801 of Vpset.

The test and pulse width setting circuit 801 sets the voltage V to Vpset (step S506).

The test and pulse width setting circuit 801 then runs the pulse disappearance setting detection pattern 820 again (step S507), and resets the voltage at which the assist of the SRAM 10 is canceled, to Vpset.

The LSI tester 53 then executes a normal LSI test on the SRAM 10 (step S508). The LSI tester 53 performs pass/fail determination based on the result of the LSI test (step S509).

Figure 36:
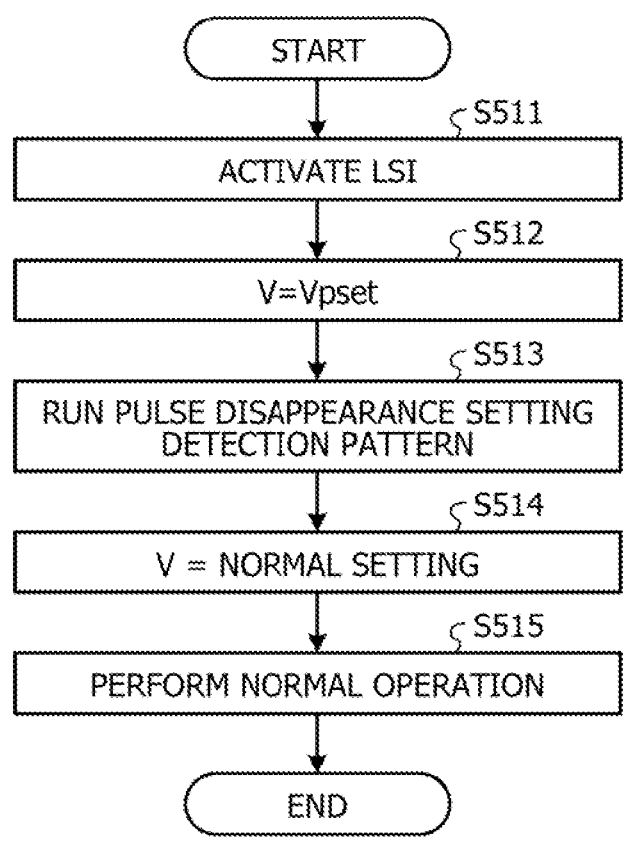
FIG. 36 is a flowchart of an operation of a system in which an SRAM according to Embodiment 8 is installed.

FIG. 36 is a flowchart of an operation of a system in which the SRAM according to Embodiment 8 is mounted. A flow of the operation of the system in which the SRAM 10 is mounted is described next with reference to FIG. 36, the SRAM 10 subjected to the setting by the test and pulse width setting circuit 801 according to the present embodiment. The test and pulse width setting circuit 801 writes Vpset, determined in step S506 of the flow of FIG. 35, to, for example, a ROM external to the LSI 1.

The LSI 1 is activated by being powered on (step S511).

The LSI 1 reads Vpset from the external ROM by using an LSI activation program, and sets the voltage V to Vpset (step S512).

Next, the LSI 1 runs the pulse disappearance setting detection pattern 820, and sets the voltage at which the assist is canceled, for the Vdd dependence generation circuit 103 of the SRAM 10 in the LSI 1 (step S513).

In the LSI 1, the voltage V is returned to a normal setting without turning-off of the power supply (step S514). The LSI 1 then shifts to a normal operation (step S515).

As described above, the test and pulse width setting circuit according to the present embodiment determines the lower limit of the assist cancel voltage by gradually reducing the assist cancel voltage while performing the SRAM function test. The test and pulse width setting circuit may thereby set the lower limit of the voltage at which the assist is canceled, according to the finish of the memory cell at that time, without being restricted to the standard value presented by the semiconductor manufacturer. Accordingly, the power increase and the stress on the memory cell due to the assist may be suppressed to the minimum.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor storage device comprising:
    a storage element that holds data;
    a bit line that is coupled to the storage element and in which step-down to reference voltage causes data held in the storage element to be inverted,
    a first step-down circuit that steps down bit line voltage to a first predetermined value equal to or below the reference voltage, the bit line voltage being voltage applied to the bit line; and
    a control circuit that detects a first voltage change based on a first output from a first inverter which has a voltage dependence of an occurring delay and a second output from a second inverter in which a voltage dependence of an occurring delay is larger than that of the first inverter, and that controls a step-down amount of the bit line voltage by the first step-down circuit depending on an amount of the detected first voltage change.

2. The semiconductor storage device according to claim 1, wherein
    in the control circuit, a predetermined signal having a voltage change at a specific timing is inputted into each of the first inverter and the second inverter, and
    the control circuit calculates a difference between a timing of the first output with respect to the voltage change of the predetermined signal and a timing of the second output with respect to the voltage change of the predetermined signal, as the amount of the detected first voltage change, and causes the first step-down circuit to step down the bit line voltage to the first predetermined value for a period of the difference.

3. The semiconductor storage device according to claim 1, further comprising
    a holding circuit that causes the first step-down circuit to keep on stepping down the bit line voltage to the first predetermined value, for a predetermined period.

4. The semiconductor storage device according to claim 1, further comprising
a second step-down circuit that further steps down the bit line voltage from the first predetermined value by a second predetermined value, wherein
the control circuit
further includes a third inverter that is coupled to the second inverter in series and in which a voltage dependence of an occurring delay is larger than that of the first inverter,
controls the step-down amount of the bit line voltage by the first step-down circuit, based on the first output and the second output, and
detects a second voltage change based on the first output and a third output from the third inverter, and controls a step-down amount of the bit line voltage by the second step-down circuit, depending on an amount of the detected second voltage change.

5. The semiconductor storage device according to claim 1, wherein
the control circuit
further includes a fourth inverter that is coupled to the second inverter in series and in which a voltage dependence of an occurring delay is larger than that in the first inverter,
selects one of the second output and a fourth output from the fourth inverter,
when the second output is selected, controls the step-down amount of the bit line voltage by the first step-down circuit depending on the amount of the first voltage change, and
when the fourth output is selected, detects a third voltage change based on the first output and the fourth output, and controls the step-down amount of the bit line voltage by the first step-down circuit depending on an amount of the detected third voltage change.

6. The semiconductor storage device according to claim 1, further comprising
a test execution circuit that detects a fourth voltage change based on a fifth output from a fifth inverter which has a voltage dependence of an occurring delay and a sixth output from a sixth inverter in which a voltage dependence of an occurring delay is larger than that of the fifth inverter, and that determines the step-down amount of the bit line voltage by the first step-down circuit depending on an amount of the detected fourth voltage change, wherein
the control circuit controls the step-down amount of the bit line voltage by the first step-down circuit, based on the step-down amount of the bit line voltage determined by the test execution circuit.

7. A control method of a semiconductor storage device comprising:
stepping down, by a first step-down circuit, a bit line voltage to a first predetermined value equal to or below the reference voltage, the bit line voltage being voltage applied to a bit line that is coupled to the storage element and in which step-down to reference voltage causes data held in a storage element to be inverted; and
detecting, by a control circuit, a first voltage change based on a first output from a first inverter which has a voltage dependence of an occurring delay and a second output from a second inverter in which a voltage dependence of an occurring delay is larger than that of the first inverter and controlling a step-down amount of the bit line voltage by the first step-down circuit depending on an amount of the detected first voltage change.

* * * * *